(12) United States Patent
Haynes et al.

(10) Patent No.: US 10,777,377 B2
(45) Date of Patent: Sep. 15, 2020

(54) MULTI-COLUMN SPACING FOR PHOTOMASK AND RETICLE INSPECTION AND WAFER PRINT CHECK VERIFICATION

(71) Applicant: KLA-Tencor Corporation, Milpitas, CA (US)

(72) Inventors: Robert Haynes, Pleasanton, CA (US); Frank Chilese, San Ramon, CA (US); Moshe E. Preil, Sunnyvale, CA (US)

(73) Assignee: KLA-Tencor Corporation, Milpitas, CA (US)

(*) Notice: Subject to any disclaimer, the term of this patent is extended or adjusted under 35 U.S.C. 154(b) by 13 days.

(21) Appl. No.: 15/879,120

(22) Filed: Jan. 24, 2018

(65) Prior Publication Data

US 2018/0233318 A1  Aug. 16, 2018

Related U.S. Application Data

(60) Provisional application No. 62/454,807, filed on Feb. 5, 2017.

(51) Int. Cl.
*H01J 37/06* (2006.01)
*H01J 37/28* (2006.01)
(Continued)

(52) U.S. Cl.
CPC .............. *H01J 37/06* (2013.01); *G03F 1/86* (2013.01); *H01J 37/20* (2013.01); *H01J 37/244* (2013.01);
(Continued)

(58) Field of Classification Search
CPC .......... H01J 37/06; H01J 37/244; H01J 37/20; H01J 37/28; H01J 2237/2814;
(Continued)

(56) References Cited

U.S. PATENT DOCUMENTS 5,384,463 A * 1/1995 Honjo ............... G03F 1/86
250/396 R
6,476,390 B1 * 11/2002 Murakoshi ......... G01N 23/225
250/306
(Continued)

FOREIGN PATENT DOCUMENTS

WO    0139243 A1    5/2001

OTHER PUBLICATIONS

International Search Report dated May 21, 2018 for PCT/US2018/016761.

*Primary Examiner* — Michael Maskell
(74) *Attorney, Agent, or Firm* — Suiter Swantz pc llo

(57) ABSTRACT

A multi-column assembly for a scanning electron microscopy (SEM) system is disclosed. The multi-column assembly includes a plurality of electron-optical columns arranged in an array defined by one or more spacings. Each electron-optical column includes one or more electron-optical elements. The plurality of electron-optical columns is configured to characterize one or more field areas on a surface of a sample secured on a stage. The number of electron-optical columns in the plurality of electron-optical columns equals an integer number of inspection areas in a field area of the one or more field areas. The one or more spacings of the plurality of electron-optical columns correspond to one or more dimensions of the inspection areas.

21 Claims, 15 Drawing Sheets

(51) Int. Cl.
*H01J 37/20* (2006.01)
*G03F 1/86* (2012.01)
*H01J 37/244* (2006.01)
*H01L 21/66* (2006.01)

(52) U.S. Cl.
CPC ....... *H01J 37/28* (2013.01); *H01J 2237/2448* (2013.01); *H01J 2237/24475* (2013.01); *H01J 2237/2814* (2013.01); *H01J 2237/2817* (2013.01); *H01L 22/12* (2013.01)

(58) Field of Classification Search
CPC ..... H01J 2237/24475; H01J 2237/2817; H01J 2237/2448; G03F 1/86; H01L 22/12
USPC ................................ 250/306, 307, 310, 311
See application file for complete search history.

(56) References Cited

U.S. PATENT DOCUMENTS

| | | | |
|---|---|---|---|
| 6,855,929 B2* | 2/2005 | Kimba | G01N 23/225 250/307 |
| 6,977,375 B2* | 12/2005 | Yin | G21K 1/087 850/6 |
| 2010/0320382 A1 | 12/2010 | Almogy et al. | |
| 2014/0158886 A1* | 6/2014 | Takashi | H01J 37/265 250/310 |

* cited by examiner

MULTI-COLUMN SPACING FOR PHOTOMASK AND RETICLE INSPECTION AND WAFER PRINT CHECK VERIFICATION

CROSS-REFERENCE TO RELATED APPLICATIONS

The present application claims the benefit under 35 U.S.C. § 119(e) of U.S. Provisional Patent Application Ser. No. 62/454,807, filed Feb. 5, 2017, entitled OPTIMUM MULTI-COLUMN PITCH SPACING FOR MASK INSPECTION AND WAFER LAYOUT FOR PRINT CHECK VERIFICATION, naming Robert Haynes, Frank Chilese, and Moshe Preil as inventors, which is incorporated herein by reference in the entirety.

TECHNICAL FIELD

The present invention generally relates to photomask/reticle and wafer inspection and review and, more particularly, to a multi-column spacing for photomask/reticle inspection and wafer print check verification.

BACKGROUND

The fabrication of semiconductor devices, such as logic and memory devices, typically includes processing a semiconductor device using a large number of semiconductor fabrication and metrology processes to form various features and multiple layers of the semiconductor devices. Select fabrication processes utilize photomasks/reticles to print features on a semiconductor device such as a wafer. As semiconductor devices become smaller and smaller laterally and extended vertically, it becomes critical to develop enhanced inspection and review devices and procedures to increase sensitivity and throughput of photomask/reticle and wafer inspection processes.

Semiconductor devices may develop defects during the fabrication processes. Inspection processes are performed at various steps during a semiconductor manufacturing process to detect defects on a specimen. Inspection processes are an important part of fabricating semiconductor devices such as integrated circuits. These inspection processes become even more important to successfully manufacture acceptable semiconductor devices as the dimensions of semiconductor devices decrease. Detection of defects has become highly desirable as the dimensions of semiconductor devices decrease, as even relatively small defects may cause unwanted aberrations in the semiconductor devices.

One inspection technology includes electron beam based inspection such as scanning electron microscopy (SEM). In some instances, scanning electron microscopy is performed via secondary electron beam collection (e.g., a secondary electron (SE) imaging system). In other instances, scanning electron microscopy is performed by splitting a single electron beam into numerous beams and utilizing a single electron-optical column to individually tune and scan the numerous beams (e.g., a multi-beam SEM system). In other instances, scanning electron microscopy is performed via an SEM system which includes an increased number of electron-optical columns (e.g., a multi-column SEM system).

In a multi-column SEM system, the smaller the portion of the full field area covered by a particular electron-optical column, the greater the total overlap that is necessary to stitch the images gathered from each electron-optical column back together. In addition, a multi-column SEM system may not include the capability to scan both a photomask/reticle and a wafer. Further, the total time a multi-column SEM system requires for high resolution characterization of a photomask/reticle or wafer is dependent on the number of, and spacing between, the multiple electron-optical columns. For example, the amount of time required for inspection of the full field area is increased if the multiple electron-optical columns are spaced such that the total inspection area of all columns is larger than the full field area of the photomask/reticle, as the columns within the field area have to inspect more surface area to make up for the non-inspecting columns outside the field area. By way of another example, depending on surrounding material of the SEM system, the surface of a photomask/reticle or wafer may be charged due to exposure of electron-optical columns outside of the photomask/reticle or wafer full field, which may in turn interfere with adjacent, in-field electron-optical columns.

Therefore, it would be advantageous to provide a system and method that cures the shortcomings described above.

SUMMARY

A multi-column assembly for a scanning electron microscopy (SEM) system is disclosed, in accordance with one or more embodiments of the present disclosure. In one embodiment, the multi-column assembly includes a plurality of electron-optical columns arranged in an array defined by one or more spacings. In another embodiment, each electron-optical column includes one or more electron-optical elements. In another embodiment, the plurality of electron-optical columns is configured to characterize one or more field areas on a surface of a sample secured on a stage. In another embodiment, the number of electron-optical columns in the plurality of electron-optical columns equals an integer number of inspection areas in a field area of the one or more field areas. In another embodiment, the one or more spacings of the plurality of electron-optical columns correspond to one or more dimensions of the inspection areas.

A multi-column assembly for a scanning electron microscopy (SEM) system is disclosed, in accordance with one or more embodiments of the present disclosure. In one embodiment, the multi-column assembly includes a plurality of electron-optical columns arranged in an array defined by one or more spacings. In another embodiment, each electron-optical column includes one or more electron-optical elements. In another embodiment, two or more instances of a particular field are printed on a surface of a sample secured on a stage. In another embodiment, a first electron-optical column of the plurality of electron-optical columns is configured to characterize a first inspection area within a first instance of the particular field. In another embodiment, at least an additional electron-optical column of the plurality of electron-optical columns is configured to characterize at least an additional inspection area within at least an additional instance of the particular field. In another embodiment, the at least the additional inspection area is a different portion of the particular field than the first inspection area.

A multi-column scanning electron microscopy (SEM) system is disclosed, in accordance with one or more embodiments of the present disclosure. In one embodiment, the multi-column SEM system includes an electron beam source assembly including a plurality of electron beam sources configured to generate a plurality of electron beams. In another embodiment, the multi-column SEM system includes a stage configured to secure a sample. In another embodiment, the multi-column SEM system includes a multi-column assembly. In another embodiment, the multi-column assembly includes a plurality of electron-optical columns arranged in an array defined by one or more spacings. In another embodiment, each electron-optical column includes one or more electron-optical elements. In another embodiment, the plurality of electron-optical columns is configured to characterize one or more field areas on a surface of the sample secured on the stage. In another embodiment, the number of electron-optical columns in the plurality of electron-optical columns equals an integer number of inspection areas in a field area of the one or more field areas. In another embodiment, the one or more spacings of the plurality of electron-optical columns correspond to one or more dimensions of the inspection areas. In another embodiment, each electron-optical column of the plurality of electron-optical columns receives an electron beam of the plurality of electron beams. In another embodiment, the plurality of electron-optical columns directs the plurality of electron beams to the surface of the sample. In another embodiment, the sample emits or scatters electrons in response to at least one electron beam of the plurality of electron beams. In another embodiment, at least one electron-optical column of the plurality of electron-optical columns detects at least a portion of the emitted or scattered electrons.

A multi-column scanning electron microscopy (SEM) system is disclosed, in accordance with one or more embodiments of the present disclosure. In one embodiment, the multi-column SEM system includes an electron beam source assembly including a plurality of electron beam sources configured to generate a plurality of electron beams. In another embodiment, the multi-column SEM system includes a stage configured to secure a sample. In another embodiment, the multi-column SEM system includes a multi-column assembly. In another embodiment, the multi-column assembly includes a plurality of electron-optical columns arranged in an array defined by one or more spacings. In another embodiment, each electron-optical column includes one or more electron-optical elements. In another embodiment, two or more instances of a particular field are printed on a surface of the sample secured on the stage. In another embodiment, a first electron-optical column of the plurality of electron-optical columns is configured to characterize a first inspection area within a first instance of the particular field. In another embodiment, at least an additional electron-optical column of the plurality of electron-optical columns is configured to characterize at least an additional inspection area within at least an additional instance of the particular field. In another embodiment, the at least the additional inspection area is a different portion of the particular field than the first inspection area. In another embodiment, each electron-optical column of the plurality of electron-optical columns receives an electron beam of the plurality of electron beams. In another embodiment, the plurality of electron-optical columns directs the plurality of electron beams to the surface of the sample. In another embodiment, the sample emits or scatters electrons in response to at least one electron beam of the plurality of electron beams. In another embodiment, at least one electron-optical column of the plurality of electron-optical columns detects at least a portion of the emitted or scattered electrons.

A method is disclosed, in accordance with one or more embodiments of the present disclosure. In one embodiment, the method may include, but is not limited to, characterizing one or more field areas on a surface of a sample via a plurality of electron-optical columns of a multi-column scanning electron microscopy (SEM) review tool arranged in an array defined by one or more spacings. In another embodiment, each electron-optical column includes one or more electron-optical elements. In another embodiment, the number of electron-optical columns in the plurality of electron-optical columns equals an integer number of inspection areas in a field area of the one or more field areas. In another embodiment, the one or more spacings of the plurality of electron-optical columns correspond to one or more dimensions of the inspection areas.

A method is disclosed, in accordance with one or more embodiments of the present disclosure. In one embodiment, the method may include, but is not limited to, characterizing two or more instances of a particular field printed on a surface of a sample via a plurality of electron-optical columns of a multi-column scanning electron microscopy (SEM) review tool arranged in an array defined by one or more spacings. In another embodiment, each electron-optical column includes one or more electron-optical elements. In another embodiment, a first electron-optical column of the plurality of electron-optical columns is configured to characterize a first inspection area within a first instance of the particular field. In another embodiment, at least an additional electron-optical column of the plurality of electron-optical columns is configured to characterize at least an additional inspection area within at least an additional instance of the particular field. In another embodiment, the at least the additional inspection area is a different portion of the particular field than the first inspection area.

A method is disclosed, in accordance with one or more embodiments of the present disclosure. In one embodiment, the method may include, but is not limited to, determining one or more dimensions of one or more field areas on a surface of the sample. In another embodiment, the method may include, but is not limited to, determining one or more spacings for a plurality of electron-optical columns of a multi-column scanning electron microscopy (SEM) review tool based on the one or more dimensions of the one or more field areas. In another embodiment, the method may include, but is not limited to, defining an integer number of inspection areas in the one or more field areas. In another embodiment, the number of electron-optical columns in the plurality of electron-optical columns equals an integer number of inspection areas in a field area of the one or more field areas. In another embodiment, the one or more spacings of the plurality of electron-optical columns correspond to one or more dimensions of the inspection areas.

A method is disclosed, in accordance with one or more embodiments of the present disclosure. In one embodiment, the method may include, but is not limited to, determining one or more dimensions of two or more instances of a particular field printed on a surface of the sample. In another embodiment, the method may include, but is not limited to, determining one or more spacings for a plurality of electron-optical columns of a multi-column scanning electron microscopy (SEM) review tool based on the one or more dimensions of the one or more fields printed on the surface of the sample. In another embodiment, the method may include, but is not limited to, defining a plurality of inspection areas in the two or more instances of a particular field printed on the surface of the sample. In another embodiment, a first electron-optical column of the plurality of electron-optical columns is configured to characterize a first inspection area within a first instance of the particular field. In another embodiment, at least an additional electron-optical column of the plurality of electron-optical columns is configured to characterize at least an additional inspection area within at least an additional instance of the particular field.

In another embodiment, the at least the additional inspection area is a different portion of the particular field than the first inspection area.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A-7E, a multi-column spacing for photomask/reticle inspection and wafer print check verification is described, in accordance with one or more embodiments of the present disclosure.

Embodiments of the present disclosure are directed to a multi-column spacing for photomask/reticle inspection and wafer print check verification. Embodiments of the present disclosure are also directed to a method of determining a multi-column spacing for photomask/reticle inspection and wafer print check verification. Embodiments of the present disclosure are also directed to a characterization tool and characterization system configured with a multi-column spacing for photomask/reticle inspection and wafer print check verification.

Figure 1A:
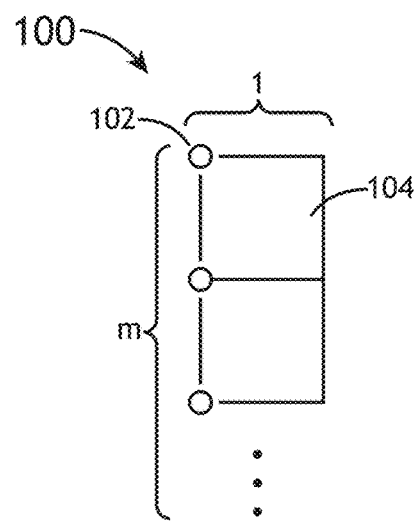
FIG. 1A illustrates a simplified block diagram depicting a multi-column spacing pattern, in accordance with one or more embodiments of the present disclosure.
Figure 1B:
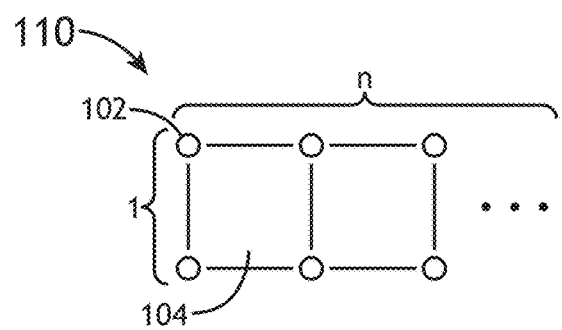
FIG. 1B illustrates a simplified block diagram depicting a multi-column spacing, in accordance with one or more embodiments of the present disclosure.
Figure 1C:
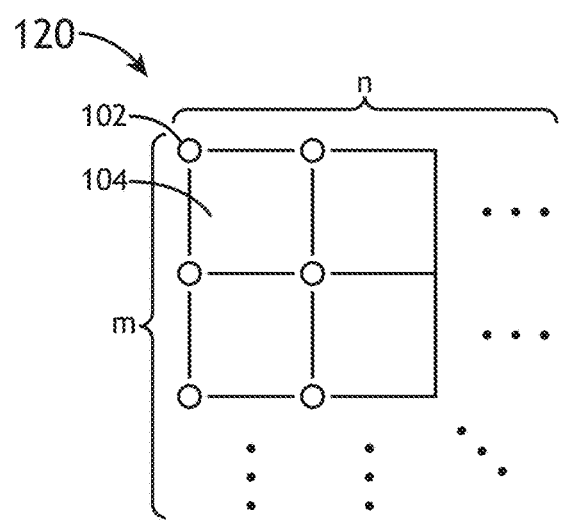
FIG. 1C illustrates a simplified block diagram depicting a multi-column spacing, in accordance with one or more embodiments of the present disclosure.

FIGS. 1A-1C generally illustrate a simplified block diagram depicting a multi-column spacing, in accordance with one or more embodiments of the present disclosure.

In one embodiment, a field of a photomask/reticle or wafer is inspected via an array of two or more electron-optical columns 102. For example, as illustrated in FIG. 1A, an array 100 of two or more electron-optical columns 102 may include an m×1 pattern. By way of another example, as illustrated in FIG. 1B, an array 110 of two or more electron-optical columns 102 may include a 1×n pattern. By way of another example, as illustrated in FIG. 1C, an array 120 of two or more electron-optical columns 102 may include an m×n pattern. It is noted herein that "electron-optical column" and "electron beam column" may be considered synonymous for purposes of the present disclosure.

In another embodiment, the two or more electron-optical columns 102 are separated by a selected spacing. For example, the selected spacing between adjacent electron-optical columns 102 may be equal in a first direction and/or a second direction different from the first direction. By way of another example, the selected spacing between adjacent electron-optical columns 102 may be substantially equal in a first direction and/or a second direction different from the first direction. By way of another example, the selected spacing between at least one set of adjacent electron-optical columns 102 may be different than the spacing between at least a second set of adjacent electron-optical columns 102 in a first direction and/or a second direction different from the first direction. It is noted herein that "spacing" and "pitch spacing" may be considered synonymous for purposes of the present disclosure.

In another embodiment, the array of two or more electron-optical columns 102 separates the field of the photomask/reticle or wafer into two or more inspection areas 104. In another embodiment, the two or more inspection areas 104 include a set of one or more dimensions with a y-component and an x-component. For example, the two or more inspection areas 104 may be equal in size. By way of another example, the two or more inspection areas 104 may be substantially equal in size. By way of another example, a first inspection area 104 may be different in size than a second inspection area 104. In general, the array of two or more electron-optical columns 102 may include any number of electron-optical columns 102 that separates the field of the photomask/reticle or wafer into any number of inspection areas 104. Therefore, the above description should not be interpreted as a limitation on the scope of the present disclosure, but merely an illustration.

In another embodiment, the selected spacing in the first direction and/or in the second direction corresponds to the set of dimensions of the two or more inspection areas 104. For example, the selected spacing in the first direction and/or in the second direction may be equal or substantially equal to the set of one or more dimensions of the two or more inspection areas 104. It is noted herein, however, that the selected spacing in the first direction and/or in the second direction corresponds to the set of dimensions of the two or more inspection areas 104 (e.g., are different). Therefore, the above description should not be interpreted as a limitation on the scope of the present disclosure, but merely an illustration.

It is noted herein the rows and/or columns of the two or more electron-optical columns 102 may be labelled such that the two or more inspection areas 104 may be mapped and/or arranged based on a particular row-column intersection. In addition, although embodiments of the present disclosure are directed to the particular inspection areas 104, being labeled based on the labels given to the electron-optical columns 102, respectively, it is noted herein the particular inspection areas 104 may be labelled via any labelling scheme known in the art. Therefore, the above description should not be interpreted as a limitation on the scope of the present disclosure, but merely an illustration.

In another embodiment, each of the two or more electron-optical columns 102 inspects a particular inspection area 104 of the two or more inspection areas 104. For example, the two or more inspection areas 104 may not include any overlap, such that each of the two or more electron-optical columns 102 singularly inspects a particular area. By way of another example, the two or more inspection areas 104 may include a selected amount of overlap, such that at least two of the two or more electron-optical columns 102 may re-scan a portion of field of the photomask/reticle. In this regard, the inspection areas 104 may be stitched back together during post-processing of the images. It is noted herein the amount of overlap may be selected to minimize inspection time during the image-gathering phase of inspection and/or an image post-processing phase of inspection.

It is noted herein the two or more electron-optical columns 102 may inspect the two or more inspection areas 104 simultaneously, substantially simultaneously, or in a sequential order. In addition, it is noted herein the two or more electron-optical columns 102 may inspect a particular inspection area 104 via any pattern known in the art. Further, although embodiments of the present disclosure are directed to the electron-optical columns 102 starting at the top-left of a particular inspection area 104, respectively, it is noted herein that the electron-optical columns 102 may start at any location within a particular inspection area 104. Therefore, the above description should not be interpreted as a limitation on the scope of the present disclosure, but merely an illustration.

Figure 2:
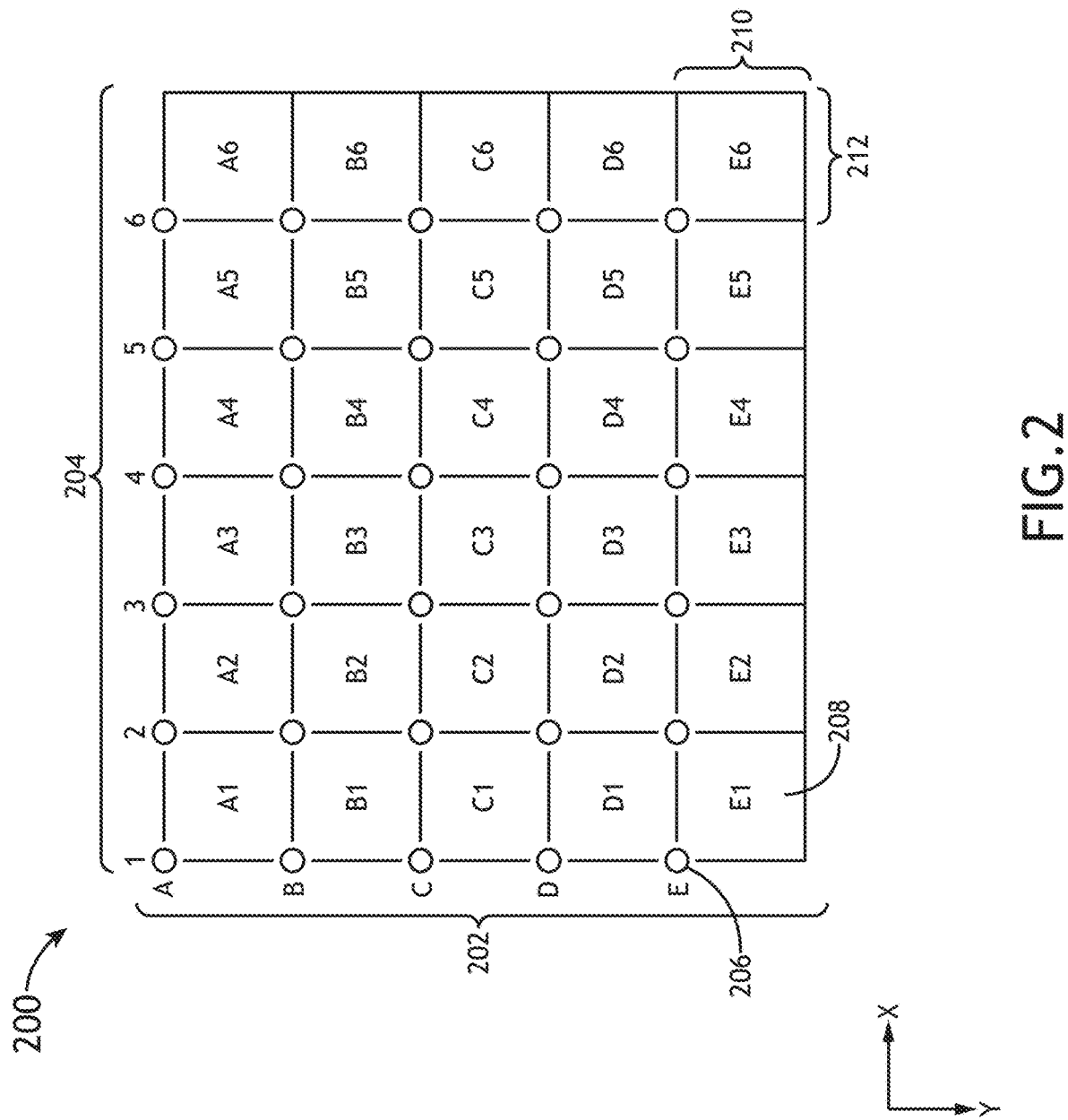
FIG. 2 illustrates a simplified block diagram depicting a multi-column spacing for photomask/reticle inspection, in accordance with one or more embodiments of the present disclosure.

FIG. 2 illustrates a simplified block diagram depicting a multi-column spacing for photomask/reticle inspection, in accordance with one or more embodiments of the present disclosure. In one embodiment, a full field 200 of a photomask/reticle includes a set of one or more dimensions with a y-component 202 and an x-component 204. In another embodiment, the full field 200 is inspected as a single field by an array of two or more electron-optical columns 206. In another embodiment, the array of two or more electron-optical columns 206 separate the full field 200 of the photomask/reticle into two or more inspection areas 208. In another embodiment, the two or more inspection areas 208 include a set of one or more dimensions with a y-component 210 and an x-component 212, where the y-component 210 and the x-component 212 is dependent on the spacing between the two or more electron-optical columns 206. For example, the two or more inspection areas 208 may be equal in size. By way of another example, the two or more inspection areas 208 may be substantially equal in size. By way of another example, a first inspection area 208 may be different in size than a second inspection area 208.

In another embodiment, the spacing between the two or more electron-optical columns 206 in a first direction and/or in a second direction corresponds to the set of dimensions of the two or more inspection areas 208. For example, the spacing between the two or more electron-optical columns 206 in the first direction and/or in the second direction may be equal or substantially equal to the set of one or more dimensions of the two or more inspection areas 208. It is noted herein, however, that the spacing between the two or more electron-optical columns 206 in the first direction and/or in the second direction corresponds to the set of dimensions of the two or more inspection areas 208 (e.g., are different). Therefore, the above description should not be interpreted as a limitation on the scope of the present disclosure, but merely an illustration.

In one instance, the full field 200 of the photomask/reticle may include, but is not limited to, a set of one or more dimensions with a y-component 202 of 104.0 mm and an x-component 204 of 132.0 mm. The array may include, but is not limited to, a 5×6 grid of thirty electron-optical columns 206 separating the full field 200 of the photomask/reticle into thirty inspection areas 208. The thirty inspection areas 208 may include, but are not limited to, a set of one or more dimensions with a y-component 210 of 20.8 mm (e.g., 104.0 mm/5 electron-optical columns 206) and an x-component 212 of 22.0 mm (e.g., 132.0 mm/6 electron-optical columns 206). It is noted herein the 5 rows of the thirty electron-optical columns 206 may be labelled as A-E and the 6 columns of the thirty electron-optical columns 206 may be labelled as 1-6, such that the thirty inspection areas 208 may be labelled A1-E6.

Although embodiments of the present disclosure illustrate that the spacing within the array of electron-optical columns 206 is selected such that the inspection area 208 inspected by each electron-optical column 206 does not include any overlap, it is noted herein that some overlap may be implemented to stitch the images of the inspection areas 208 together. For example, each electron-optical column 206 with a 20-mm spacing may inspect a 20.1 mm square area, where the excess 0.1 mm square area is sectioned and overlapped by up to four adjacent inspection areas 208. It is contemplated, however, that it may be possible to stitch the images of the inspection areas 208 together without the use of overlapping sections. Therefore, the above description should not be interpreted as a limitation on the scope of the present disclosure, but merely an illustration.

Figure 3:
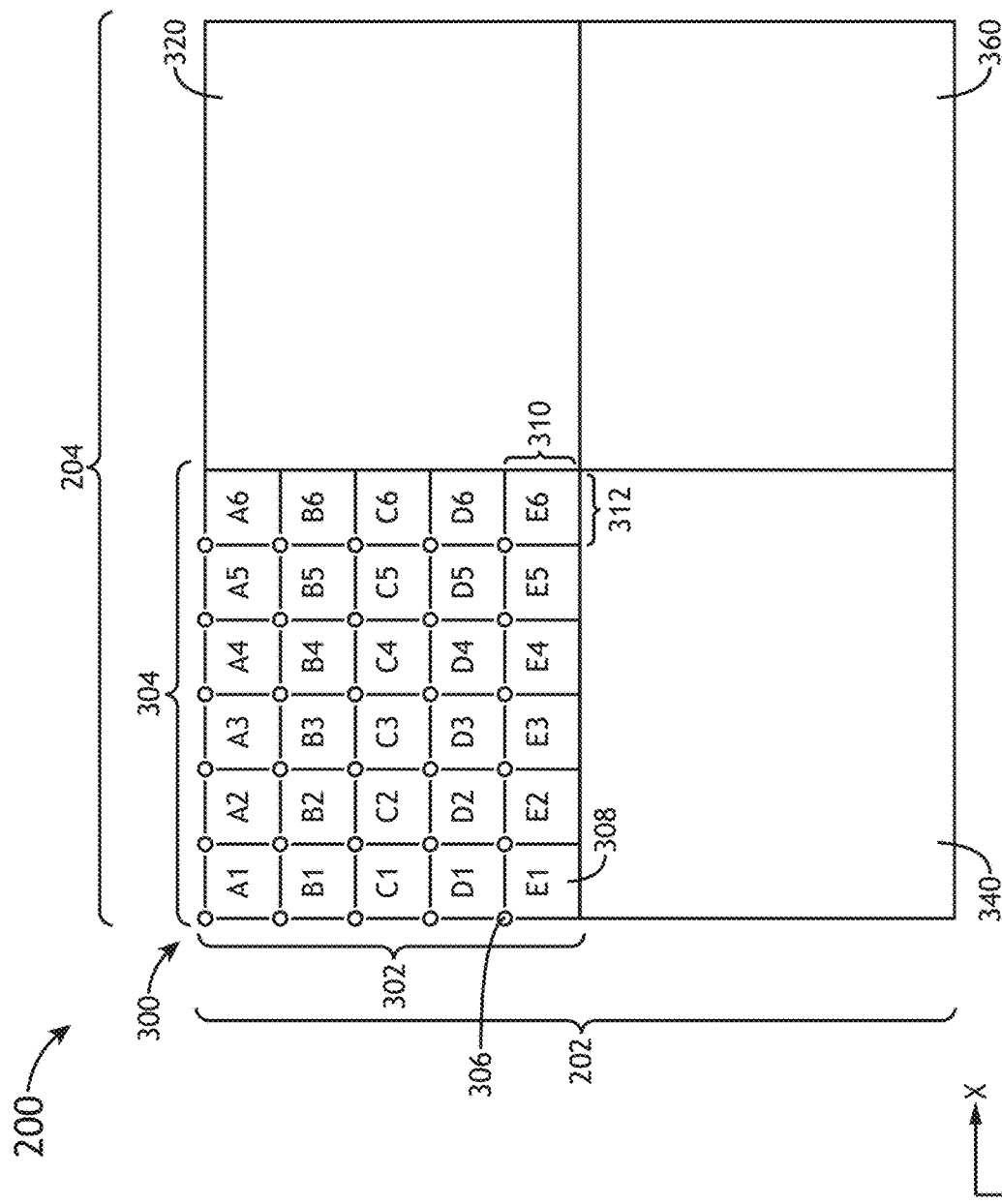
FIG. 3 illustrates a simplified block diagram depicting a multi-column spacing for photomask/reticle inspection, in accordance with one or more embodiments of the present disclosure.

FIG. 3 illustrates a simplified block diagram depicting a multi-column spacing for photomask/reticle inspection, in accordance with one or more embodiments of the present disclosure. In one embodiment, the full field 200 of the photomask/reticle is separated into two or more field areas, where the two or more field areas are inspected in sequence. For example, the two or more field areas may be equal in size. By way of another example, the two or more field areas may be substantially equal in size. By way of another example, a first field area may be different in size than a second field area. In one instance, the full field 200 may be segmented into, but is not limited to, four field areas (or quadrants) 300, 320, 340, 360. It is noted herein the following embodiments directed to the field area 300 of the full field 200 may be directed to any of the field areas 320, 340, 360 of the full field 200.

In another embodiment, the field area 300 of the full field 200 is inspected by an array of two or more electron-optical columns 306. In another embodiment, the array of two or more electron-optical columns 306 separate the field area 300 of the photomask/reticle into two or more inspection areas 308. In another embodiment, the two or more inspection areas 308 include a set of one or more dimensions with a y-component 310 and an x-component 312, where the y-component 310 and the x-component 312 are dependent on the spacing between the two or more electron-optical columns 306. For example, the two or more inspection areas 308 may be equal in size. By way of another example, the two or more inspection areas 308 may be substantially equal in size. By way of another example, a first inspection area 308 may be different in size than a second inspection area 308.

In another embodiment, the spacing between the two or more electron-optical columns 306 in a first direction and/or in a second direction corresponds to the set of dimensions of the two or more inspection areas 308. For example, the spacing between the two or more electron-optical columns 306 in the first direction and/or in the second direction may be equal or substantially equal to the set of one or more dimensions of the two or more inspection areas 308. It is noted herein, however, that the spacing between the two or more electron-optical columns 306 in the first direction and/or in the second direction corresponds to the set of dimensions of the two or more inspection areas 308 (e.g., are different). Therefore, the above description should not be interpreted as a limitation on the scope of the present disclosure, but merely an illustration.

In one instance, the field area 300 of the full field 200 may include, but is not limited to, a set of one or more dimensions with a y-component 302 of 52.0 mm (e.g., one-half of the y-component 202 of the full field 200) and an x-component 304 of 66.0 mm (e.g., one-half of the x-component 204 of the full field 200). The array may include, but is not limited to, a 5×6 grid of thirty electron-optical columns 306 separating the field area 300 of the full field 200 into thirty inspection areas 308. The thirty inspection areas 308 may include, but are not limited to, a set of one or more dimensions with a y-component 310 of 10.4 mm (e.g., 52.0 mm/5 electron-optical columns 306) and an x-component 312 of 11.0 mm (e.g., 66.0 mm/6 electron-optical columns 306). It is noted herein the 5 rows of the thirty electron-optical columns 306 may be labelled as A-E and the 6 columns of the thirty electron-optical columns 306 may be labelled as 1-6, such that the thirty inspection areas 308 may be labelled from A1-E6.

Although embodiments of the present disclosure illustrate that the spacing within the array of electron-optical columns 306 is selected such that the inspection area 308 inspected by each column 306 does not include any overlap, it is noted herein that some overlap may be implemented to stitch the images of the inspection areas 308 together. For example, an electron-optical column 306 with a 20-mm spacing may inspect a 20.1 mm square area, where the excess 0.1 mm square area is sectioned and overlapped by up to four adjacent inspection areas 308. It is contemplated, however, that it may be possible to stitch the images of the inspection areas 308 together without the use of overlapping sections. Therefore, the above description should not be interpreted as a limitation on the scope of the present disclosure, but merely an illustration.

In another embodiment, once the field area 300 is inspected by the array of electron-optical columns 306, the array of electron-optical columns 306 inspects the other field areas in sequence. For example, the array of electron-optical columns 306 may inspect field area 300, then inspect field area 320, then inspect field area 340, then inspect field area 360. By way of another example, the array of electron-optical columns 306 may inspect the fields areas 300, 320, 340, and 360 in an alternative order.

Figure 4A:
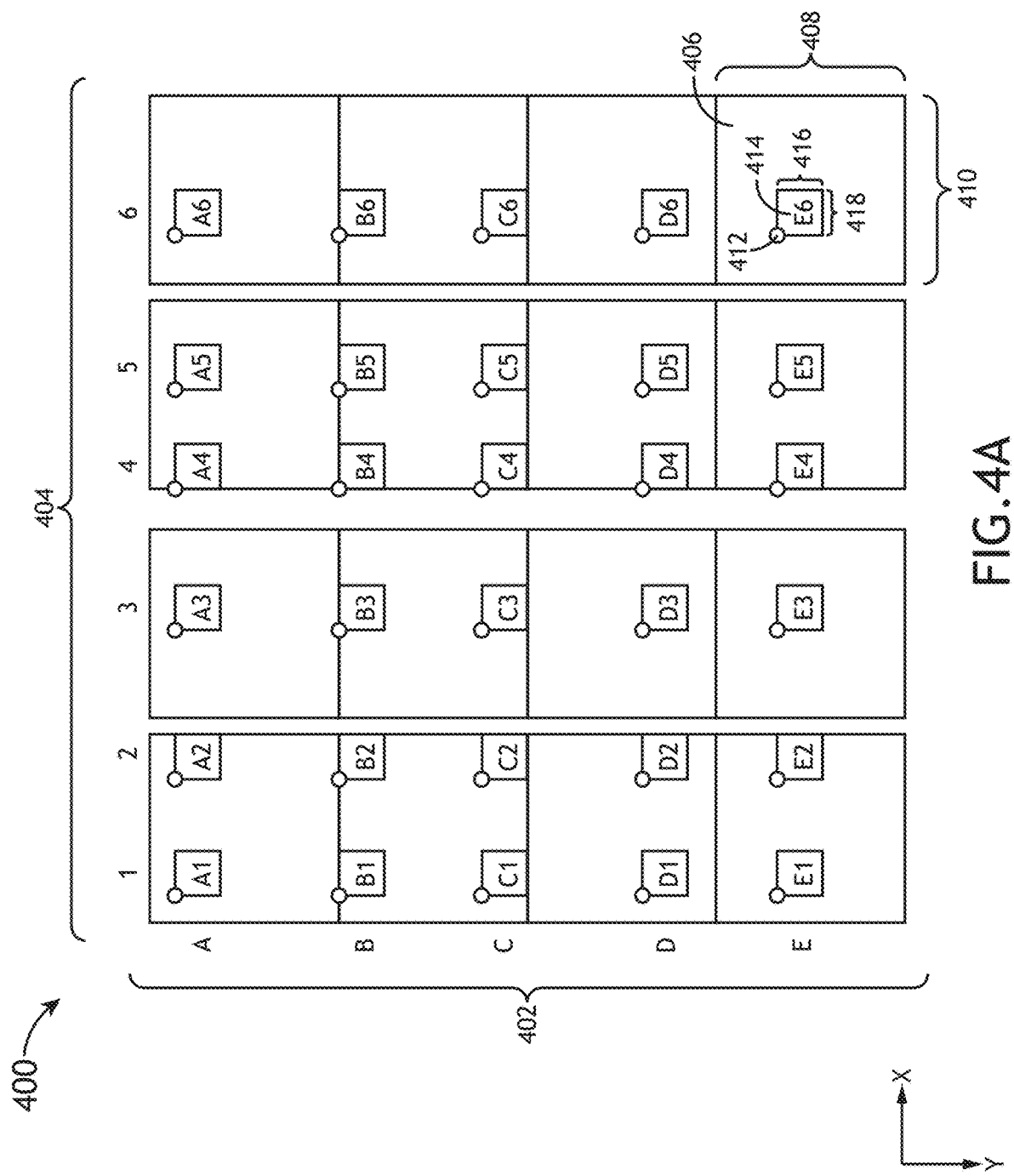
FIG. 4A illustrates a simplified block diagram depicting a multi-column spacing for wafer print check verification, in accordance with one or more embodiments of the present disclosure.
Figure 4B:
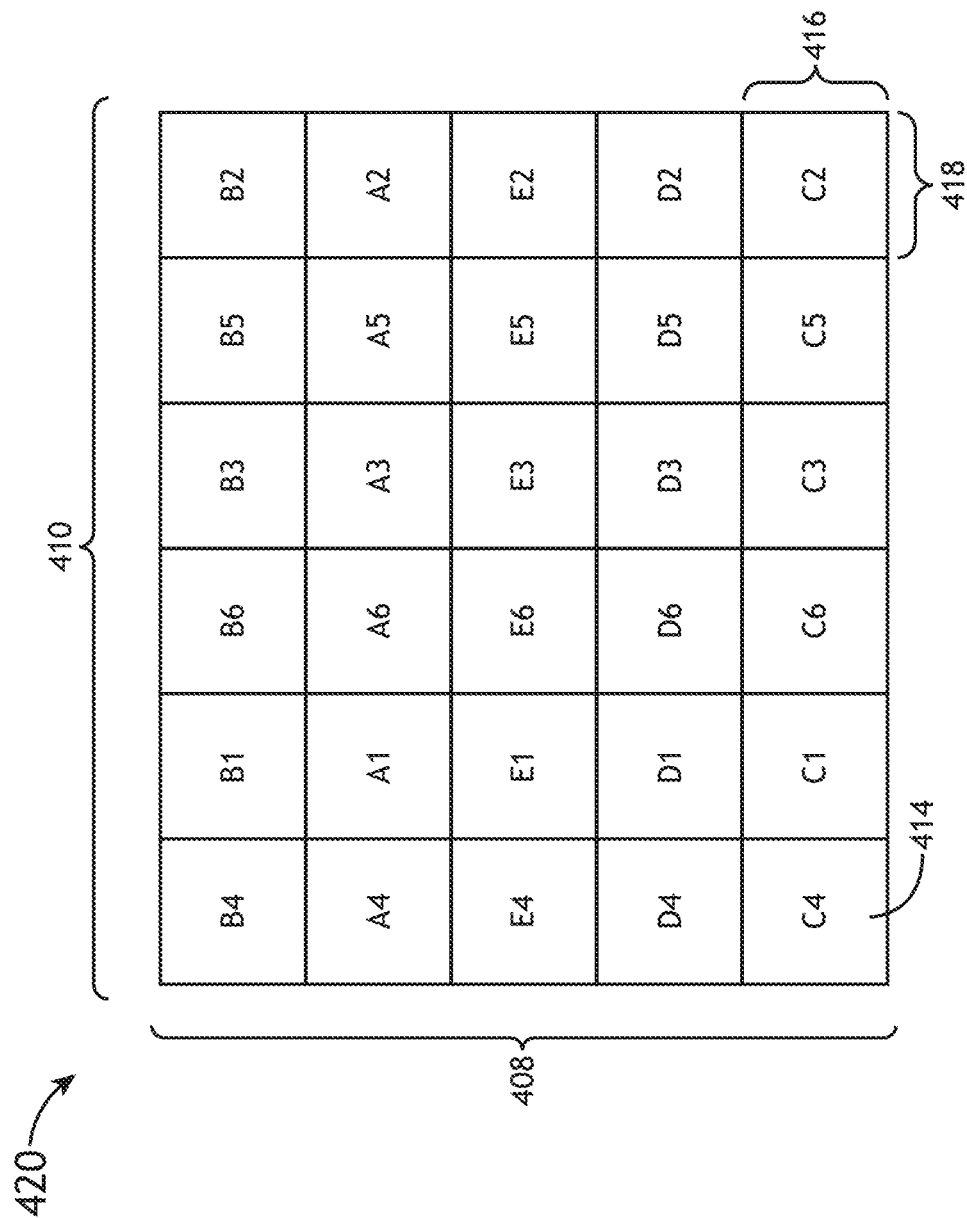
FIG. 4B illustrates a simplified block diagram of a synthetic field generated from a multi-column spacing for wafer print check verification, in accordance with one or more embodiments of the present disclosure.

FIGS. 4A and 4B generally illustrate a simplified block diagram depicting a multi-column spacing for wafer print check verification, in accordance with one or more embodiments of the present disclosure.

In one embodiment, the print area 400 of a wafer includes a set of one or more dimensions with a y-component 402 and an x-component 404. In another embodiment, a photomask/reticle field is printed one or more times in the print area 400 based on a reduction ratio. For example, the reduction ratio may include, but is not limited to, 1:1, 2:1, 4:1, or the like. For instance, a photomask/reticle field may be printed sixteen times in the print area 400 at a 4:1 reduction ratio. In another embodiment, printing the photomask/reticle field into the print area 400 generates two or more field areas 406.

In another embodiment, the two or more field areas 406 include a set of one or more dimensions with a y-component 408 and an x-component 410. For example, the two or more field areas 406 may be equal in size. By way of another example, the two or more field areas 406 may be substantially equal in size. By way of another example, a first field area 406 may be different in size than a second field area 406. It is noted herein the two or more field areas 506 may be identical or substantially similar.

In another embodiment, the print area 400 is inspected by an array of two or more electron-optical columns 412. In another embodiment, the array of two or more electron-optical columns 412 separates the print area 400 into two or more inspection areas 414. In another embodiment, the two or more inspection areas 414 include a set of one or more dimensions with a y-component 416 and an x-component 418, where the y-component 416 and the x-component 418 is dependent on the spacing between the two or more electron-optical columns 412. For example, the two or more inspection areas 414 may be equal in size. By way of another example, the two or more inspection areas 414 may be substantially equal in size. By way of another example, a first inspection area 414 may be different in size than a second inspection area 414.

In another embodiment, the spacing between the two or more electron-optical columns 412 in a first direction and/or in a second direction corresponds to the set of dimensions of the two or more inspection areas 414. For example, the spacing between the two or more electron-optical columns 412 in the first direction and/or in the second direction may be equal or substantially equal to the set of one or more dimensions of the two or more inspection areas 414. It is noted herein, however, that the spacing between the two or more electron-optical columns 412 in the first direction and/or in the second direction corresponds to the set of dimensions of the two or more inspection areas 414 (e.g., are different). Therefore, the above description should not be interpreted as a limitation on the scope of the present disclosure, but merely an illustration.

In another embodiment, the array of two or more electron-optical columns 412 characterizes select inspection areas of the two or more inspection areas 414 within a first print area 406 and select inspection areas of the two or more inspection areas 414 within at least a second field area 406 substantially simultaneously. In another embodiment, each inspection area 414 of the two or more inspection areas 414 is located within the boundaries of a particular print area 406 (e.g., does not cross a boundary line between adjacent print areas 406). It is noted herein, however, that at least one inspection area 414 of the two or more inspection areas 414 may cross the boundary between adjacent print areas 406. Therefore, the above description should not be interpreted as a limitation on the scope of the present disclosure, but merely an illustration.

FIG. 4B illustrates a synthetic full field 420 populated with the two or more inspection areas 414 scanned by the two or more electron-optical columns 412 and spread across the two or more field areas 406 within the print area 400 of the wafer, in accordance with one or more embodiments of the present disclosure. In one embodiment, the synthetic full field 420 includes a set of one or more dimensions with a y-component 408 and an x-component 410, as the total area of the inspection areas 414 equals the dimensions of a single field area 406. In another embodiment, the thirty inspected areas 414 are organized in the synthetic full field 420 based on their location within the field areas 406, with each inspection area 414 including a set of one or more dimensions with a y-component 408 and an x-component 410.

Although embodiments of the present disclosure illustrate that the spacing within the array of electron-optical columns 412 is selected such that the inspection area 414 inspected by each electron-optical column 412 does not include any overlap, it is noted herein that some overlap may be implemented to stitch the images of the inspection areas 414 together. For example, an electron-optical column 412 with a 20-mm spacing may inspect a 20.1 mm square area, where the excess 0.1 mm square area is sectioned and overlapped by up to four adjacent inspection areas 208. It is contemplated, however, that it may be possible to stitch the images of the inspection areas 414 together without the use of overlapping sections. Therefore, the above description should not be interpreted as a limitation on the scope of the present disclosure, but merely an illustration.

In one instance, the print area 400 may include, but is not limited to, a set of one or more dimensions with a y-component 402 of 104.0 mm and an x-component 404 of 132.0 mm. A photomask/reticle field area with a y-component of 104.0 mm and the x-component of 132.0 mm may be printed onto the print area 400 at a 4:1 reduction ratio, such that the photomask/reticle field area is printed as sixteen field areas 406 in the print area 400. Each field area 406 may include a y-component 408 of 26.0 mm and an x-component 410 of 32.0 mm. The array may include, but is not limited to, a 5×6 grid of thirty electron-optical columns 412. The sixteen field areas 406 may each be split into thirty inspection areas 414, where each inspection area 414 may include, but are not limited to, a set of one or more dimensions with a y-component 416 of 5.2 mm (e.g., 26.0 mm/5 electron-optical columns) and an x-component 418 of 5.3 mm (e.g., 32.0 mm/6 electron-optical columns).

The thirty inspection areas 414 may be spread throughout the sixteen field areas 406. Each of the thirty electron-optical columns 412 may inspect a different inspection area 414 of the thirty inspection areas 414, not including overlap necessary to stitch multiple inspection images together into a single image. It is noted herein the 5 rows of the thirty electron-optical columns 412 may be labelled as A-E and the 6 columns of the thirty electron-optical columns 412 may be labelled as 1-6, such that the thirty areas 414 may be labelled from A1-E6.

The thirty inspection areas 414 may be organized into the synthetic full field 420 based on their location in the printed pattern. For example, due to the arrangement of the thirty electron-optical columns 412 within the sixteen field areas 406, as illustrated in FIG. 4A, inspection area B4 is the top left corner of the synthetic full field 420 in FIG. 4B (as compared to inspection area A1 being the top-left corner of the inspected field, as illustrated in FIGS. 2 and 3).

Figure 5A:
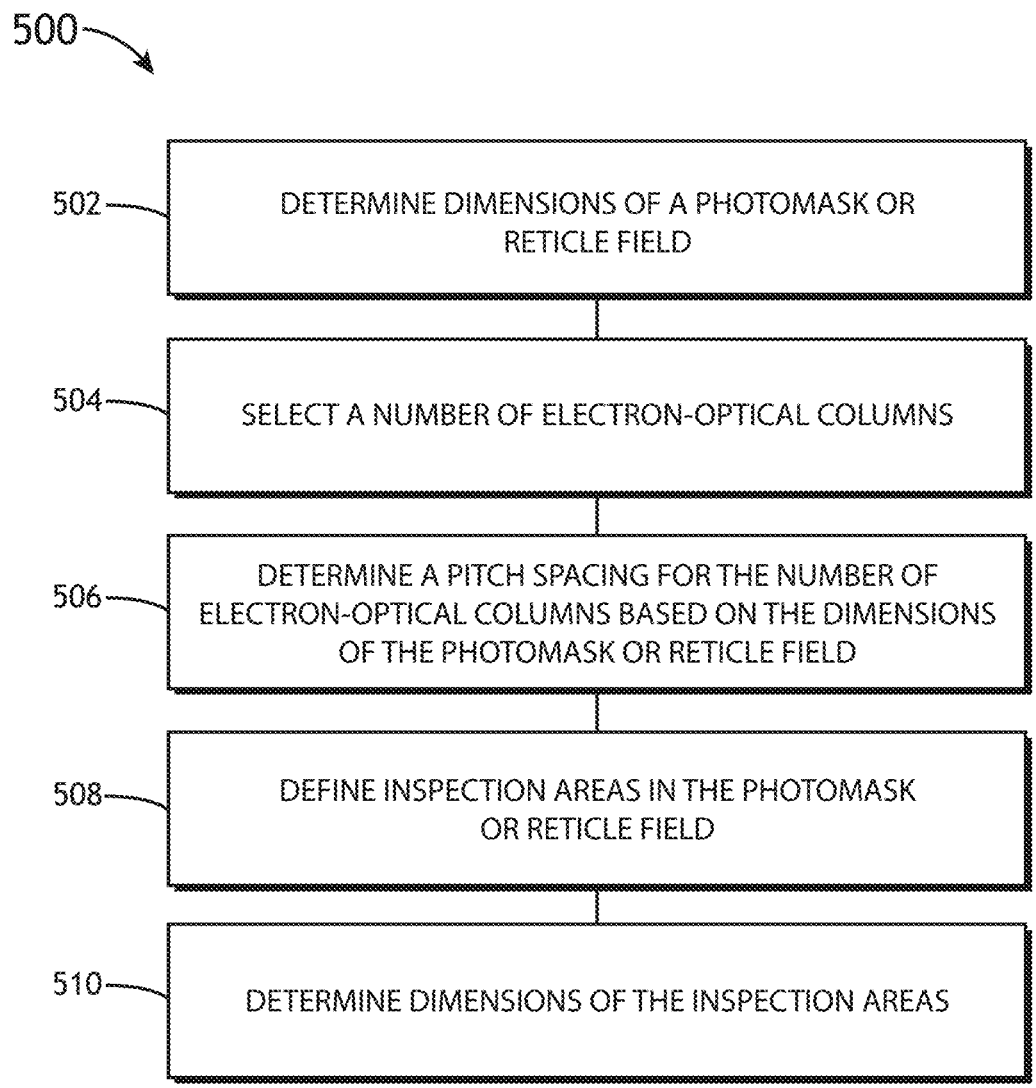
FIG. 5A illustrates a process flow diagram depicting a method for determining a multi-column spacing for photomask/reticle inspection, in accordance with one or more embodiments of the present disclosure.

FIG. 5A illustrates a method 500 for determining a multi-column spacing for photomask/reticle inspection, in accordance with one or more embodiments of the present disclosure.

In step 502, one or more dimensions of a photomask/reticle field are determined. In one embodiment, the one or more dimensions include an x-component and a y-component. In another embodiment, the one or more dimensions are acquired from design data for the photomask/reticle. In another embodiment, the one or more dimensions are acquired via one or more measurements.

In step 504, a number of electron-optical columns is selected. In one embodiment, the number of electron-optical columns includes two or more electron-optical columns. In another embodiment, a pattern for two or more electron-optical columns is selected. For example, the pattern may include, but is not limited to, a 1×m array, an n×1 array, or an m×n array. In another embodiment, the pattern is selected to minimize the amount of time necessary to inspect the photomask/reticle field. In another embodiment, the pattern is selected to fit the two or more electron-optical columns within the one or more dimensions of the photomask/reticle field.

In step 506, a spacing for the number of electron-optical columns based on the one or more dimensions of the photomask/reticle field is determined. In one embodiment, the spacing between adjacent electron-optical columns is equal or substantially equal in a first direction and/or a second direction. In another embodiment, the spacing between a first set of adjacent electron-optical columns is not equal to the spacing between a second set of adjacent electron-optical columns. In another embodiment, the spacing in the first direction is equal, substantially equal, or not equal to the spacing in the second direction. In another embodiment, the spacing is determined via one or more measurements. In another embodiment, the spacing is determined via one or more calculations.

In step 508, two or more inspection areas are defined in the photomask/reticle field. In one embodiment, each of the two or more inspection areas correspond to a particular electron-optical column of the two or more electron-optical columns. In another embodiment, the two or more inspection areas are defined based on the spacing in the first direction and/or the second direction. For example, the spacing between the two or more electron-optical columns in the first direction and/or in the second direction may correspond to the set of dimensions of the two or more inspection areas. For instance, the spacing between the two or more electron-optical columns in the first direction and/or in the second direction may be equal or substantially equal to the set of one or more dimensions of the two or more inspection areas. It is noted herein, however, that the spacing between the two or more electron-optical columns in the first direction and/or in the second direction corresponds to the set of dimensions of the two or more inspection areas (e.g., are different). Therefore, the above description should not be interpreted as a limitation on the scope of the present disclosure, but merely an illustration.

In step 510, one or more dimensions of the two or more inspection areas are determined. In one embodiment, the one or more dimensions include an x-component and a y-component. In another embodiment, the two or more inspection areas are equal in size and/or similar in shape. In another embodiment, the two or more inspection areas are substantially equal in size and/or substantially similar in shape. In another embodiment, a first inspection area is not equal in size and/or not equal in shape to a second inspection area. In another embodiment, the one or more dimensions are determined from design data for the photomask/reticle. In another embodiment, the one or more dimensions are determined via one or more measurements. In another embodiment, the one or more dimensions are determined via one or more calculations.

Figure 5B:
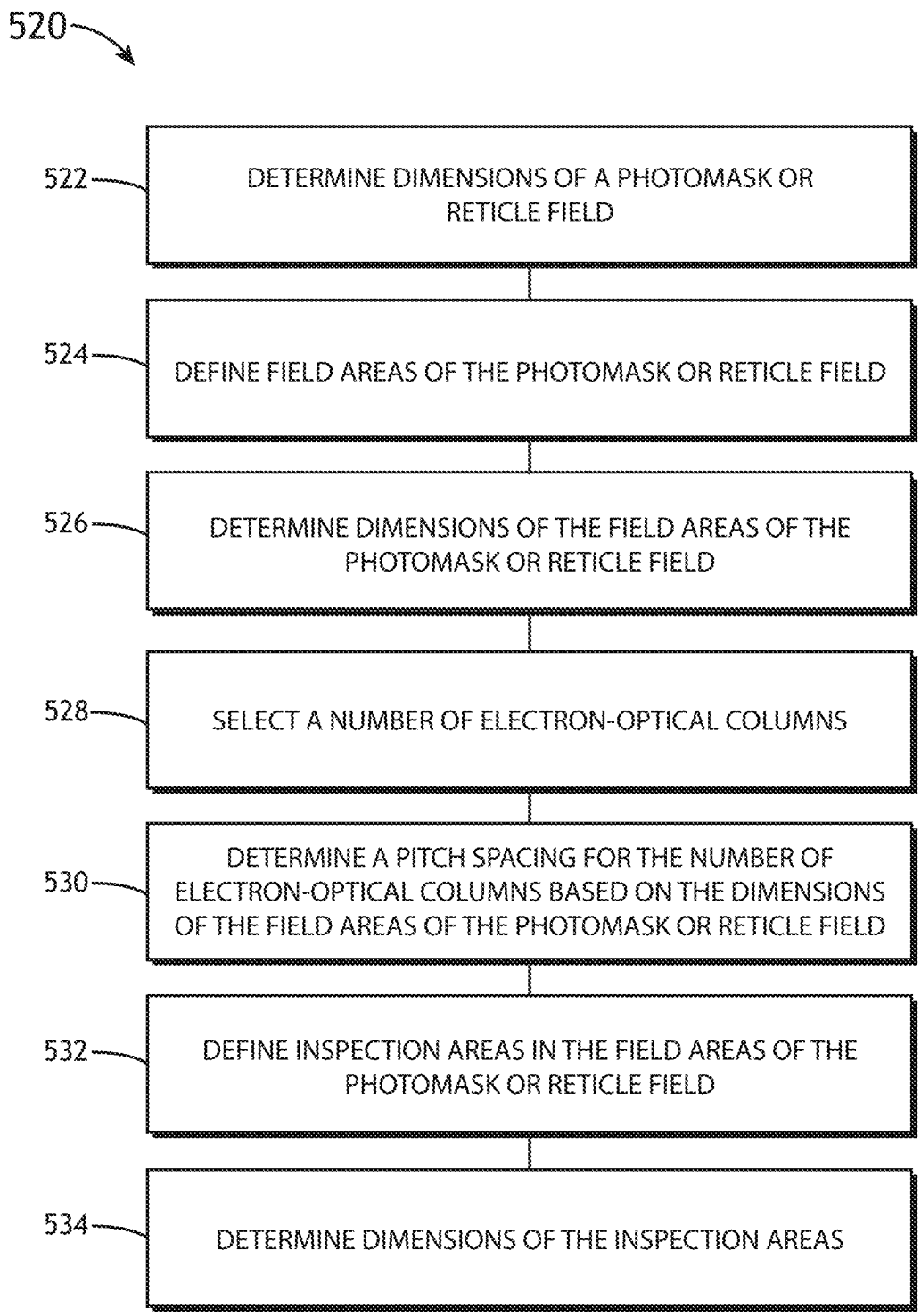
FIG. 5B illustrates a process flow diagram depicting a method for determining a multi-column spacing for photomask/reticle inspection, in accordance with one or more embodiments of the present disclosure.

FIG. 5B illustrates a method 520 for determining a multi-column spacing for photomask/reticle inspection, in accordance with one or more embodiments of the present disclosure.

In step 522, one or more dimensions of a photomask/reticle field are determined. In one embodiment, the one or more dimensions include an x-component and a y-component. In another embodiment, the one or more dimensions are acquired from design data for the photomask/reticle. In another embodiment, the one or more dimensions are acquired via one or more measurements.

In step 524, two or more field areas in the photomask/reticle field are defined. In step 526, one or more dimensions of a field area of the two or more field areas in the photomask/reticle field are determined. In one embodiment, the one or more dimensions each include an x-component and a y-component. In another embodiment, the two or more field areas are equal in size and/or similar in shape. In another embodiment, the two or more field areas are substantially equal in size and/or substantially similar in shape. For example, the photomask/reticle field may be separated into substantially equal field areas (e.g., quadrants). In another embodiment, a first field area is not equal in size and/or not equal in shape to a second field area. In another embodiment, the one or more dimensions are determined from design data for the photomask/reticle. In another embodiment, the one or more dimensions are determined via one or more measurements. In another embodiment, the one or more dimensions are determined via one or more calculations.

In step 528, a number of electron-optical columns is selected. In one embodiment, the number of electron-optical columns includes two or more electron-optical columns. In another embodiment, a pattern for two or more electron-optical columns is selected. For example, the pattern may include, but is not limited to, a 1×m array, an n×1 array, or an m×n array. In another embodiment, the pattern is selected to minimize the amount of time necessary to inspect a field area of the photomask/reticle field. In another embodiment, the pattern is selected to fit the two or more electron-optical columns within the one or more dimensions of the field area of the photomask/reticle field.

In step 530, a spacing based on the dimensions of the field area of the two or more field areas of the photomask/reticle field is determined. In one embodiment, the spacing between adjacent electron-optical columns is equal or substantially equal in a first direction and/or a second direction. In another embodiment, the spacing between a first set of adjacent electron-optical columns is not equal to the spacing between a second set of adjacent electron-optical columns. In another embodiment, the spacing in the first direction is equal, substantially equal, or not equal to the spacing in the second direction. In another embodiment, the spacing is determined via one or more measurements. In another embodiment, the spacing is determined via one or more calculations.

In step 532, two or more inspection areas are defined in the two or more field areas of the photomask/reticle field for the two or more electron-optical columns. In one embodiment, each of the two or more inspection areas correspond to a particular electron-optical column of the two or more electron-optical columns. In another embodiment, the two or more inspection areas are defined based on the spacing in the first direction and/or the second direction. For example, the spacing between the two or more electron-optical columns in the first direction and/or in the second direction may correspond to the set of dimensions of the two or more inspection areas. For instance, the spacing between the two or more electron-optical columns in the first direction and/or in the second direction may be equal or substantially equal to the set of one or more dimensions of the two or more inspection areas. It is noted herein, however, that the spacing between the two or more electron-optical columns in the first direction and/or in the second direction corresponds to the set of dimensions of the two or more inspection areas (e.g., are different). Therefore, the above description should not be interpreted as a limitation on the scope of the present disclosure, but merely an illustration.

In step 534, one or more dimensions of the two or more inspection areas are determined. In one embodiment, the one or more dimensions each include an x-component and a y-component. In another embodiment, the two or more inspection areas are equal in size and/or similar in shape. In another embodiment, the two or more inspection areas are substantially equal in size and/or substantially similar in shape. In another embodiment, a first inspection area is not equal in size and/or not equal in shape to a second inspection area. In another embodiment, the one or more dimensions are determined from design data for the photomask/reticle. In another embodiment, the one or more dimensions are determined via one or more measurements. In another embodiment, the one or more dimensions are determined via one or more calculations.

Figure 5C:
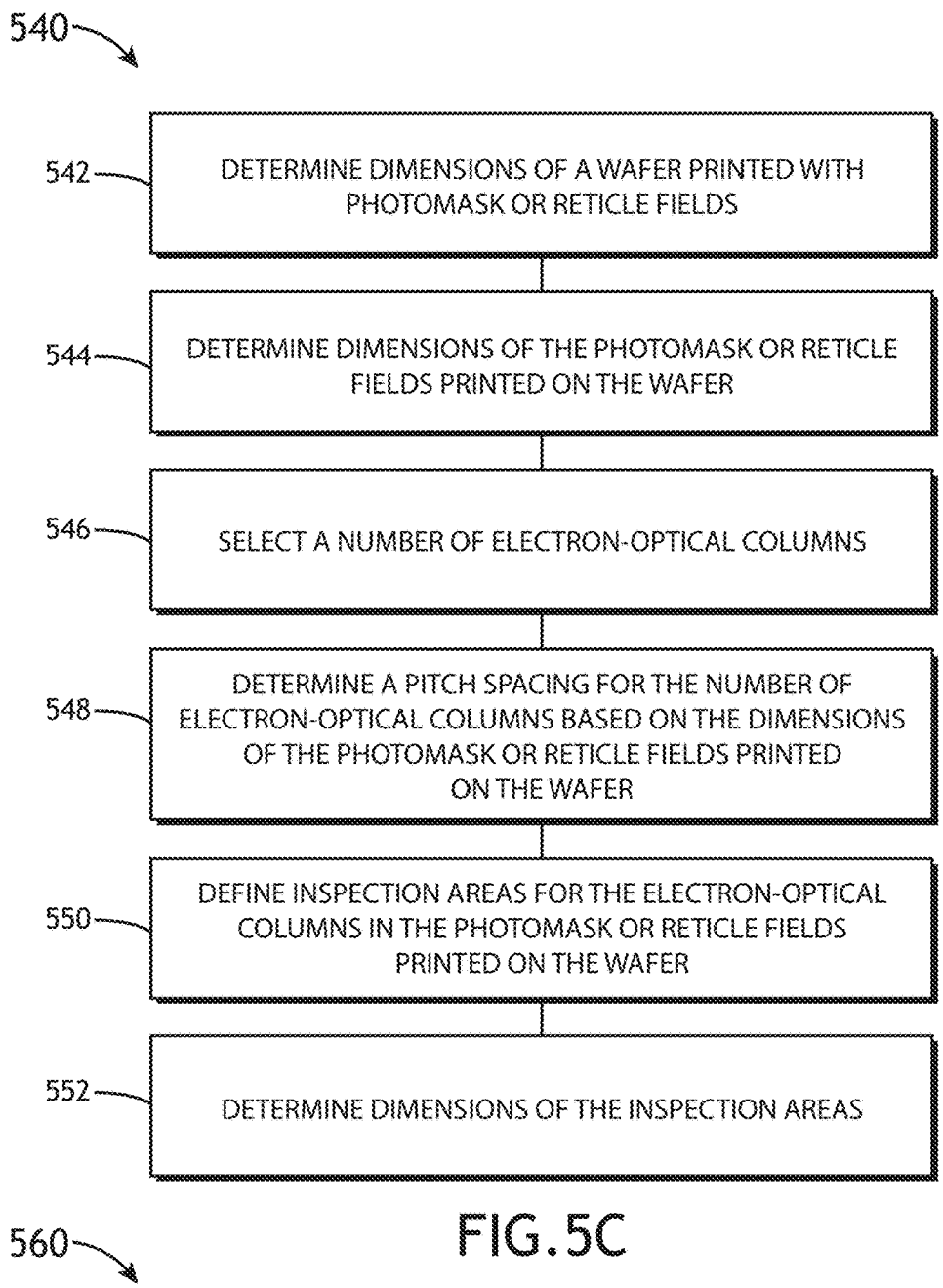
FIG. 5C illustrates a process flow diagram depicting a method for determining a multi-column spacing for wafer print check verification, in accordance with one or more embodiments of the present disclosure.

FIG. 5C illustrates a method 540 for determining a multi-column spacing for wafer print check verification, in accordance with one or more embodiments of the present disclosure.

In step 542, one or more dimensions of a wafer printed with one or more photomask/reticle fields are determined. In one embodiment, a wafer pre-printed with one or more photomask/reticle fields is received. In another embodiment, a blank wafer is received and printed. For example, the blank wafer may include a print area. By way of another example, a print reduction ratio for a photomask/reticle pattern may be selected. For instance, the reduction ratio may include, but is not limited to, 1:1, 2:1, 4:1, or the like. By way of another example, the photomask/reticle pattern may be printed two or more times in the print area of the wafer based on the reduction ratio. In another embodiment, the one or more dimensions are acquired from design data for the wafer. In another embodiment, the one or more dimensions are acquired via one or more measurements.

In step 544, one or more dimensions of the one or more photomask/reticle fields printed on the wafer are determined. In one embodiment, the one or more dimensions include an x-component and a y-component. For example, the one or more photomask/reticle fields printed on the wafer may be equal in size. By way of another example, the one or more photomask/reticle fields printed on the wafer may be substantially equal in size. Further, a first photomask/reticle field printed on the wafer may be different in size than a second photomask/reticle field printed on the wafer. In another embodiment, the one or more dimensions include an x-component and a y-component. In another embodiment, the one or more dimensions are acquired from design data for the wafer. In another embodiment, the one or more dimensions are acquired via one or more measurements.

In step 546, a number of electron-optical columns is selected. In one embodiment, the number of electron-optical columns includes two or more electron-optical columns. In another embodiment, a pattern for two or more electron-optical columns is selected. For example, the pattern may include, but is not limited to, a 1×m array, an n×1 array, or an m×n array. In another embodiment, the pattern is selected to minimize the amount of time necessary to inspect the wafer. In another embodiment, the pattern is selected to fit the two or more electron-optical columns within the one or more dimensions of the wafer.

In step 548, a spacing based on the dimensions of the photomask/reticle fields printed on the wafer is determined. In one embodiment, the spacing between adjacent electron-optical columns is equal or substantially equal in a first direction and/or a second direction. In another embodiment, the spacing between a first set of adjacent electron-optical columns is not equal to the spacing between a second set of adjacent electron-optical columns. In another embodiment, the spacing in the first direction is equal, substantially equal, or not equal to the spacing in the second direction. In another embodiment, the spacing is determined via one or more measurements. In another embodiment, the spacing is determined via one or more calculations.

In step 550, two or more inspection areas are defined in the photomask/reticle fields printed on the wafer for the two or more electron-optical columns. In one embodiment, each of the two or more inspection areas correspond to a particular electron-optical column of the two or more electron-optical columns. In another embodiment, the two or more inspection areas are defined based on the spacing in the first direction and/or the second direction. For example, the spacing between the two or more electron-optical columns in the first direction and/or in the second direction may correspond to the set of dimensions of the two or more inspection areas. For instance, the spacing between the two or more electron-optical columns in the first direction and/or in the second direction may be equal or substantially equal to the set of one or more dimensions of the two or more inspection areas. It is noted herein, however, that the spacing between the two or more electron-optical columns in the first direction and/or in the second direction corresponds to the set of dimensions of the two or more inspection areas (e.g., are different). Therefore, the above description should not be interpreted as a limitation on the scope of the present disclosure, but merely an illustration.

In step 552, one or more dimensions of the two or more inspection areas are determined. In one embodiment, the one or more dimensions each include an x-component and a y-component. In another embodiment, the two or more inspection areas are equal in size and/or similar in shape. In another embodiment, the two or more inspection areas are substantially equal in size and/or substantially similar in shape. In another embodiment, a first inspection area is not equal in size and/or not equal in shape to a second inspection area. In another embodiment, the one or more dimensions are determined from design data for the photomask/reticle. In another embodiment, the one or more dimensions are determined via one or more measurements. In another embodiment, the one or more dimensions are determined via one or more calculations.

Figure 5D:
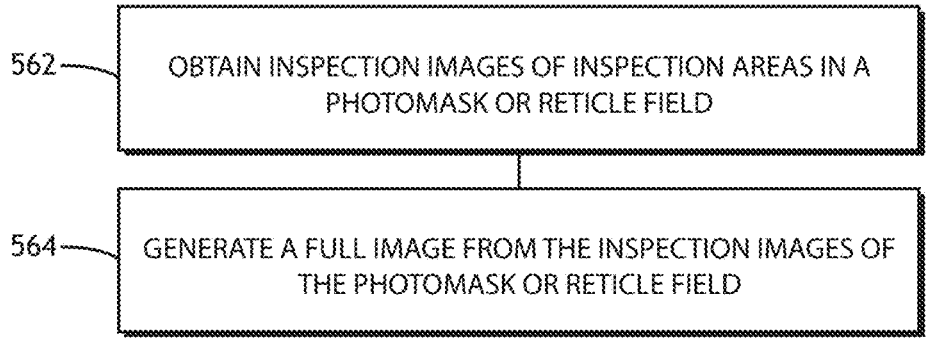
FIG. 5D illustrates a process flow diagram depicting a method for inspecting a photomask/reticle field with a scanning electron microscopy (SEM) review tool including a select multi-column spacing for photomask/reticle inspection, in accordance with one or more embodiments of the present disclosure.

FIG. 5D illustrates a method 560 for inspecting a photomask/reticle field with an SEM review tool including a select multi-column spacing for photomask/reticle inspection, in accordance with one or more embodiments of the present disclosure.

In step 562, two or more inspection images are obtained of two or more inspection areas of a photomask/reticle field. In one embodiment, the two or more inspection images are obtained via an SEM review tool including two or more electron-optical columns. In another embodiment, the SEM review tool is configured with a select spacing between the two or more electron-optical columns, where the select spacing is determined via some or all of the steps of method 500.

In step 564, a full image is generated from the two or more inspection images of the photomask/reticle field. In one embodiment, the two or more inspection images are aligned and combined based on one or more overlapping areas. In another embodiment, the two or more inspection images are not aligned and combined based on overlapping areas.

Figure 5E:
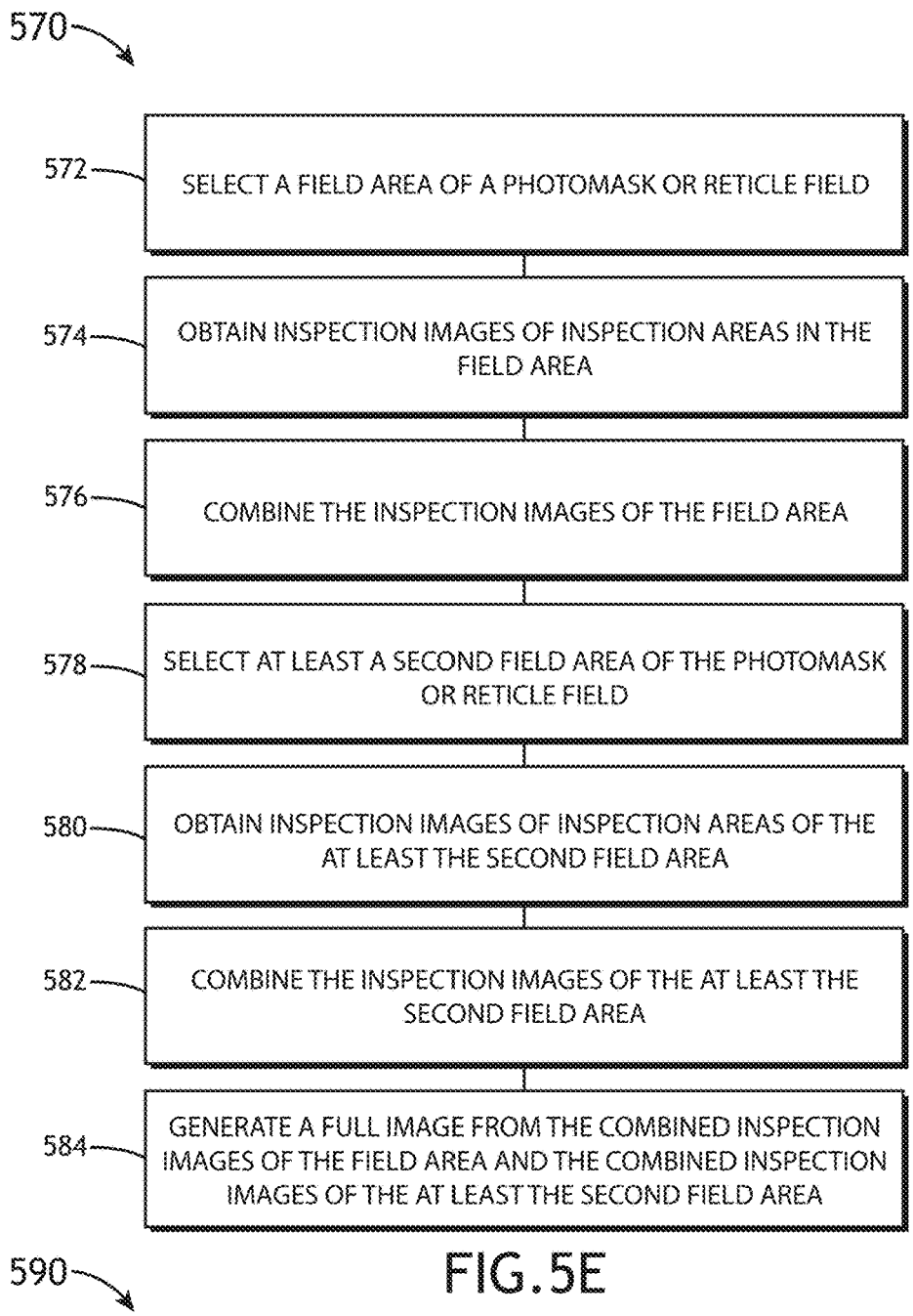
FIG. 5E illustrates a process flow diagram depicting a method for inspecting a photomask/reticle field with a scanning electron microscopy (SEM) review tool including a select multi-column spacing for photomask/reticle inspection, in accordance with one or more embodiments of the present disclosure.

FIG. 5E illustrates a method 570 for inspecting a photomask/reticle field with an SEM review tool including a select multi-column spacing for photomask/reticle inspection, in accordance with one or more embodiments of the present disclosure.

In step 572, a field area of a photomask/reticle field is selected. In one embodiment, the photomask/reticle field is separated into two or more field areas. In step 574, two or more inspection images are obtained of two or more inspection areas in the field area with an SEM review tool including two or more electron-optical columns. In one embodiment, the two or more inspection images are obtained via an SEM review tool including two or more electron-optical columns. In another embodiment, the SEM review tool is configured with a select spacing between the two or more electron-optical columns, where the select spacing is determined via some or all of the steps of method 520.

In step 576, the two or more inspection images of the field area are combined. In one embodiment, the two or more inspection images are aligned and combined based on one or more overlapping areas. In another embodiment, the two or more inspection images are not aligned based on overlapping areas.

In step 578, at least a second field area of the photomask/reticle field is selected. In step 580, two or more inspection images are obtained of two or more inspection areas in the at least the second field area with the SEM review tool. In step 582, the two or more inspection images of the at least the second field area are combined. In one embodiment, the two or more inspection images are aligned and combined based on one or more overlapping areas. In another embodiment, the two or more inspection images are not aligned based on overlapping areas.

In step 584, a full image is generated from the combined inspection images of the field area and the combined inspection images of the at least the second field area. In one embodiment, the combined inspection images of the field area and the combined inspection images of the at least the second field area are not aligned based on overlapping areas.

Figure 5F:
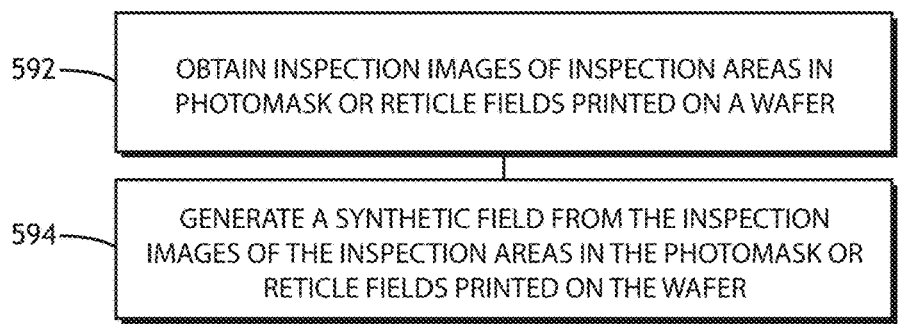
FIG. 5F illustrates a process flow diagram depicting a method for generating a synthetic field from one or more inspection images obtained via a scanning electron microscopy (SEM) review tool including a select multi-column spacing for wafer print check verification, in accordance with one or more embodiments of the present disclosure.

FIG. 5F illustrates a method 590 for generating a synthetic field from one or more inspection images obtained via an SEM review tool including a select multi-column spacing for wafer print check verification, in accordance with one or more embodiments of the present disclosure.

In step 592, two or more inspection images of two or more inspection areas in one or more photomask/reticle fields printed on a wafer are obtained. In one embodiment, the two or more inspection images are obtained via an SEM review tool including two or more electron-optical columns. In another embodiment, the SEM review tool is configured with a select spacing between the two or more electron-optical columns, where the select spacing is determined via some or all of the steps of method 540.

In step 594, a synthetic field is generated from the two or more inspection images of the two or more inspection areas in the one or more photomask/reticle fields printed on the wafer. In one embodiment, the two or more inspection images are organized in the synthetic field based on their location in the printed pattern.

Figure 6A:
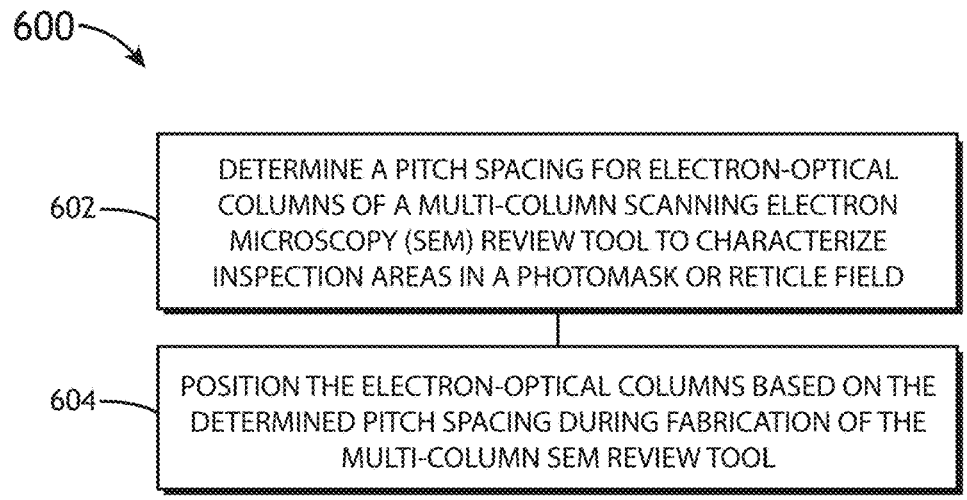
FIG. 6A illustrates a process flow diagram depicting a method for producing a multi-column scanning electron microscopy (SEM) review tool including a select multi-column spacing for photomask/reticle inspection, in accordance with one or more embodiments of the present disclosure.

FIG. 6A illustrates a method 600 for producing a multi-column SEM review tool including a select multi-column spacing for photomask/reticle inspection, in accordance with one or more embodiments of the present disclosure.

In step 602, a spacing for two or more electron-optical columns of a multi-column scanning electron microscopy (SEM) review tool to characterize two or more inspection areas in a photomask/reticle field is determined. In one embodiment, the spacing is determined via one or more steps of the method 500.

In step 604, the two or more electron-optical columns are positioned based on the determined spacing during fabrication of the multi-column SEM review tool.

Figure 6B:
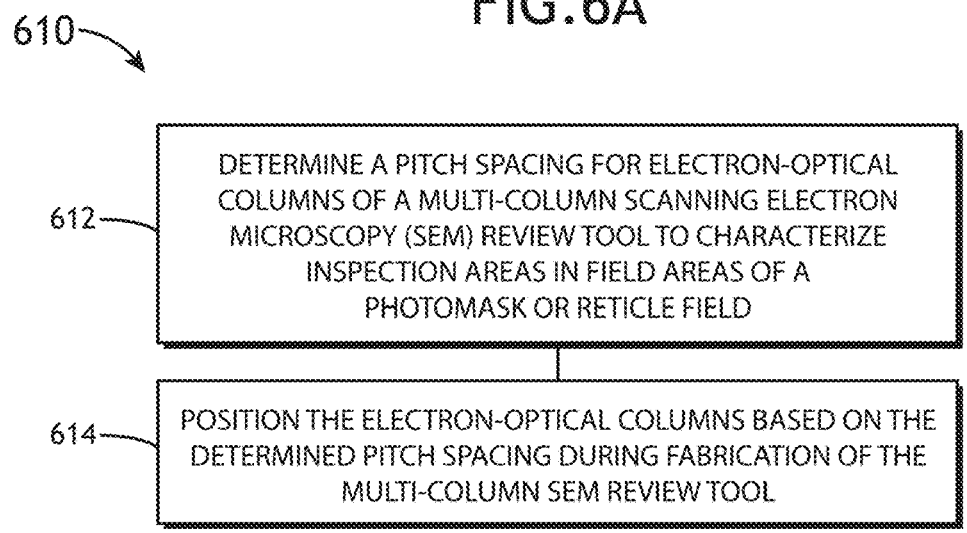
FIG. 6B illustrates a process flow diagram depicting a method for producing a multi-column scanning electron microscopy (SEM) review tool including a select multi-column spacing for wafer print check verification, in accordance with one or more embodiments of the present disclosure.

FIG. 6B illustrates a method 610 for producing a multi-column SEM review tool including a select multi-column spacing for photomask/reticle inspection, in accordance with one or more embodiments of the present disclosure.

In step 612, a spacing for two or more electron-optical columns of a multi-column scanning electron microscopy (SEM) review tool to characterize two or more inspection areas in one or more field areas of a photomask/reticle field is determined. In one embodiment, the spacing is determined via one or more steps of the method 520.

In step 614, the two or more electron-optical columns are positioned based on the determined spacing during fabrication of the multi-column SEM review tool.

Figure 6C:
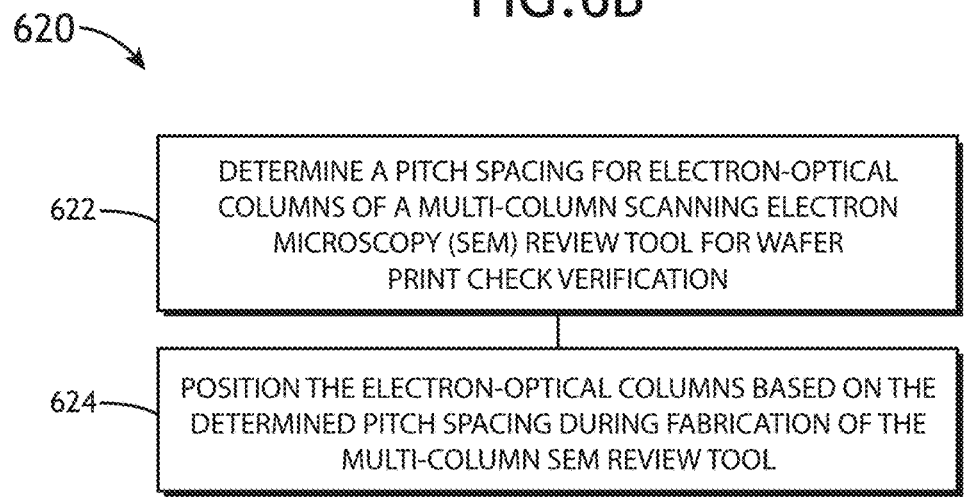
FIG. 6C illustrates a process flow diagram depicting a method for producing a multi-column scanning electron microscopy (SEM) review tool including a select multi-column spacing for wafer print check verification, in accordance with one or more embodiments of the present disclosure.

FIG. 6C illustrates a method 620 for producing a multi-column SEM review tool including a select multi-column spacing for wafer print check verification, in accordance with one or more embodiments of the present disclosure.

In step 622, a spacing for two or more electron-optical columns of a multi-column scanning electron microscopy (SEM) review tool for wafer print check verification is determined. In one embodiment, the spacing is determined via one or more steps of the method 540.

In step 624, the two or more electron-optical columns are positioned based on the determined spacing during fabrication of the multi-column SEM review tool.

In one embodiment, inspecting a photomask/reticle field and wafer print check verification are processes completed on separate SEM review tools. For example, it may not be preferred to inspect a photomask/reticle and perform wafer print check verification within the same vacuum system. It is noted herein, however, that a single SEM review tool may be implemented for both inspecting a photomask/reticle field and wafer print check verification. For example, a multi-column SEM review tool configured for photomask/reticle inspection may be re-configured to wafer print check verification by adjusting, adding, or removing one or more components of the multi-column SEM review tool. By way of another example, a multi-column SEM review tool configured for wafer print check verification may be re-configured for photomask/reticle inspection by adjusting, adding, or removing one or more components of the multi-column SEM review tool. Therefore, the above description should not be interpreted as a limitation on the scope of the present disclosure, but merely an illustration.

It is noted herein the methods 500, 520, 540, 560, 570, 590, 600, 610, 620 are not limited to the steps provided. For example, the methods 500, 520, 540, 560, 570, 590, 600, 610, 620 may instead include more or fewer steps. By way of another example, the methods 500, 520, 540, 560, 570, 590, 600, 610, 620 may perform the steps in an order other than provided. Therefore, the above description should not be interpreted as a limitation on the scope of the present disclosure, but merely an illustration.

FIGS. 7A-7E generally illustrate a characterization tool 700, in accordance with one or more embodiments of the present disclosure. The characterization tool 700 may include any appropriate characterization tool known in the art. In a general sense, the characterization tool 700 may include any characterization tool suitable for characterizing one or more photomasks/reticles or wafers.

In one embodiment, the characterization tool 700 includes one or more characterization components configured to characterize one or more photomasks/reticles or wafers and arranged in a selected and/or determined pattern based on a selected and/or determined spacing. In another embodiment, as generally illustrated in FIGS. 7A-7E, the characterization tool 700 is a scanning electron microscopy (SEM) review tool. For instance, the SEM review tool may include, but is not limited to, a secondary electron (SE) review tool 700, a multi-beam SEM review tool 700, a multi-column SEM review tool 700, or the like.

In another embodiment, the multi-column SEM review tool 700 includes an array of two or more electron-optical columns 702. In another embodiment, the two or more electron-optical columns 702 each include one or more electron-optical elements 704. In another embodiment, the one or more electron-optical elements 704 include one or more apertures 706. In another embodiment, the one or more electron-optical elements 704 include one or more condenser lenses 708. In another embodiment, the one or more electron-optical elements 704 include one or more beam deflectors 710 or scanning coils 710. In another embodiment, the one or more electron-optical elements 704 include one or more objective lenses 712. In another embodiment, the one or more electron-optical elements generally include one or more electrostatic lenses and/or one or more electromagnetic lenses.

It is noted herein the arrangement of the two or more electron-optical columns 702 within the multi-column SEM review tool 700 is determined during a design, fabrication, and/or manufacturing phase. For example, the arrangement of the two or more electron-optical columns 702 may be based on the particular size of the photomask/reticle and/or print area of a wafer, instead of being based on fabrication constraints set by the dimensions of components of the multi-column SEM review tool 700 (e.g., dimensions of the electron-optical columns 702).

In another embodiment, the one or more electron-optical elements 704 include one or more backscattered electron detectors 714. It is noted herein the multi-column SEM review tool 700 may include one or more secondary electron detectors positioned outside an electron-optical column 702 (e.g., positioned outside at least one outer-ring electron-optical column 702, where the two or more electron-optical columns 702 are arranged in an outer ring and at least one inner ring).

In one embodiment, the multi-column SEM review tool 700 includes two or more electron beam sources 716. In another embodiment, the two or more electron beam sources 716 each include an emitter 718. For example, the two or more electron beam sources 716 may include, but are not limited to, a Schottky emitter device, a carbon nanotube (CNT) emitter, a nanostructured carbon film emitter, a Muller-type emitter, or the like.

In another embodiment, the two or more electron beam sources 716 each include one or more source electron-optical elements. For example, the one or more source electron-optical elements may direct at least a portion of an electron beam generated by the emitter 718 to an electron-optical column 702.

In another embodiment, the two or more electron beam sources 716 are coupled to a set of positioners configured to actuate the two or more electron beam sources 716 in one or more directions. For example, the set of positioners may translate the two or more electron beam sources 716 in one or more of an x-direction, a y-direction, and/or a z-direction. It is noted herein that the set of positioners may be configured to actuate the two or more electron beam sources 716 either individually, as a partial unit grouping together at least some of the two or more electron beam sources 716, or as a complete unit grouping together all of the two or more electron beam sources 716.

In another embodiment, the two or more electron beam sources 716 generate two or more electron beams 720. For example, the two or more electron beam sources 716 may generate an electron beam 720 specific to a particular electron-optical column 702. By way of another example, the two or more electron beam sources 716 may generate an electron beam 720 that is split and/or directed to two or more electron-optical columns 702 via one or more electron-optical elements located between the two or more electron beam sources 716 and the two or more electron-optical columns 702.

In another embodiment, the two or more electron-optical columns 702 direct the two or more electron beams 720 onto a sample 722 secured on a sample stage 724. In another embodiment, the sample 722 may backscatter, emit, radiate, and/or deflect one or more electrons 726 in response to the two or more electron beams 720. In another embodiment, the one or more backscattered electron detectors 714 may detect the one or more electrons 726 backscattered, radiated, and/or deflected from the surface of the sample 722.

The sample 722 may include any sample suitable for inspection and/or review. In one embodiment, the sample 722 includes a photomask, reticle, semiconductor wafer, or the like. As used through the present disclosure, the term "wafer" refers to a substrate formed of a semiconductor and/or a non-semiconductor material. For instance, in the case of a semiconductor material, the wafer may be formed from, but is not limited to, monocrystalline silicon, gallium arsenide, and/or indium phosphide. As such, the term "wafer" and the term "sample" may be used interchangeably in the present disclosure. Therefore, the above description should not be interpreted as a limitation on the scope of the present disclosure but merely an illustration.

In another embodiment, where the sample 722 is a wafer, the wafer 722 is manufactured using one or more sets of wafer design data. In another embodiment, the sets of wafer design data include one or more sets of layers. For example, such layers may include, but are not limited to, a resist, a dielectric material, a conductive material, and a semi-conductive material. Many different types of such layers are known in the art, and the term wafer as used herein is intended to encompass a wafer on which all types of such layers may be formed. By way of another example, the layers formed on the wafer may be repeated one or more times within the wafer. Formation and processing of such layers of material may ultimately result in completed devices. Many different types of devices may be formed on a wafer, and the term wafer as used herein is intended to encompass a wafer on which any type of device known in the art is being fabricated.

While the fabrication, measurement, and alignment techniques described herein correspond generally to the sample 722 being a semiconductor wafer, it is to be understood that the techniques are also applicable to other types of thin polished plates as well. For example, the one or more thin polished plates may include, but are not limited to, one or more magnetic disc substrates, one or more gauge blocks, or the like. As such, the term "wafer" and the term "thin polished plate" may be used interchangeably in the present disclosure. Therefore, the above description should not be interpreted as a limitation on the scope of the present disclosure but merely an illustration.

The sample stage 724 may include any appropriate mechanical and/or robotic assembly known in the art of electron beam microscopy. In one embodiment, the sample stage 724 is an actuatable stage. For example, the sample stage 724 may include, but is not limited to, one or more translational stages suitable for selectively translating the sample 722 along one or more linear directions (e.g., x-direction, y-direction, and/or z-direction). By way of another example, the sample stage 724 may include, but is not limited to, one or more rotational stages suitable for selectively rotating the sample 722 along a rotational direction. By way of another example, the sample stage 724 may include, but is not limited to, a rotational stage and a translational stage suitable for selectively translating the sample 722 along a linear direction and/or rotating the sample 722 along a rotational direction. By way of another example, the sample stage 724 may be configured to translate or rotate the sample 722 for positioning, focusing, and/or scanning in accordance with a selected inspection or metrology algorithm, several of which are known to the art.

It is noted herein the multi-column SEM review tool 700 may be configured to both inspect a photomask/reticle and perform wafer print check verification. For example, one or more components of the multi-column SEM review tool 700 may be adjusted, added, or removed when switching from inspecting a photomask/reticle and performing wafer print check verification. For instance, the array of two or more electron-optical columns 702 may remain unadjusted when switching from inspecting a photomask/reticle and performing wafer print check verification. Alternatively, it is noted herein separate multi-column SEM review tools 700 may be utilized for inspecting a photomask/reticle versus performing wafer print check verification. For example, it may not be preferred to inspect a photomask/reticle and perform wafer print check verification within the same vacuum system. Therefore, the above description should not be interpreted as a limitation on the scope of the present disclosure, but merely an illustration.

Figure 7A:
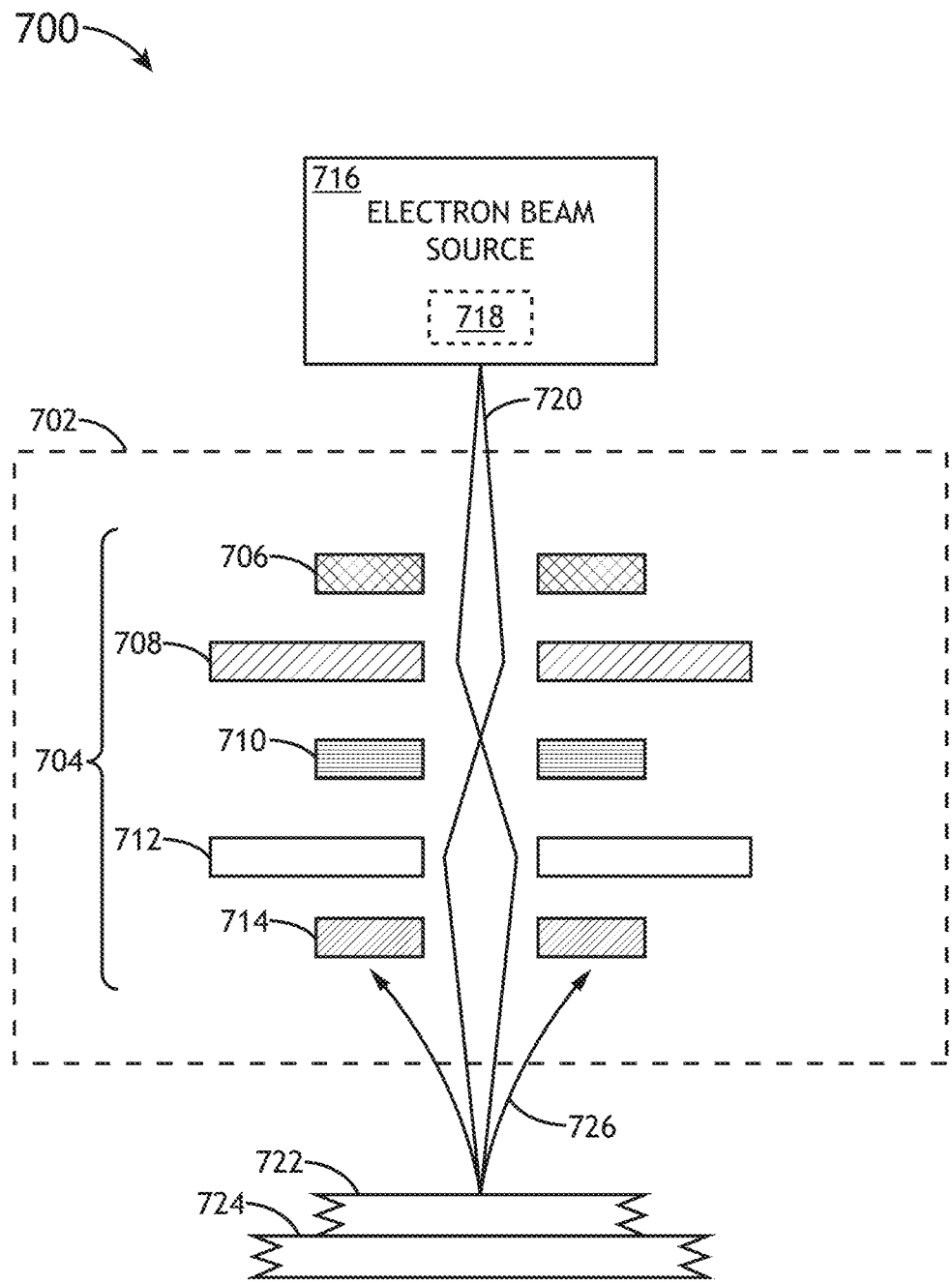
FIG. 7A illustrates a simplified block diagram of an electron-optical column of a characterization tool configured with a multi-column spacing for photomask/reticle inspection or wafer print check verification, in accordance with one or more embodiments of the present disclosure.
Figure 7B:
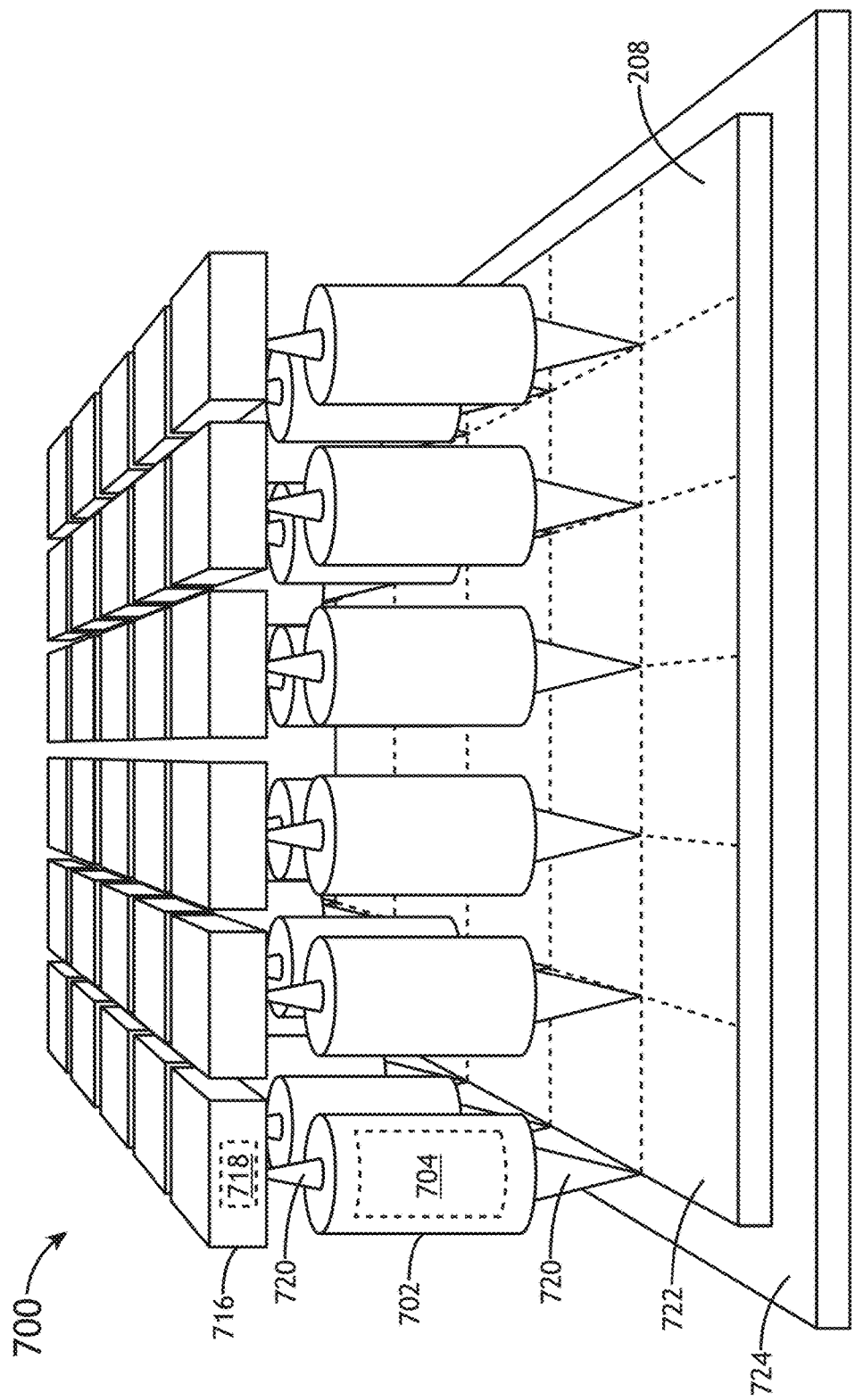
FIG. 7B illustrates a simplified block diagram of a characterization tool configured with a multi-column spacing for photomask/reticle inspection or wafer print check verification, in accordance with one or more embodiments of the present disclosure.

In one embodiment, as illustrated in FIG. 7B, the two or more electron-optical columns 702 are spaced such that the entire surface of the sample 722 is inspected (e.g., the two or more electron-optical columns 702 may inspect two or more inspection areas 208 of a full field 200, as illustrated in FIG. 2). For example, the two or more inspection areas 208 may be spaced either with or without image overlap for stitching images together into a single combined image. By way of another example, the two or more electron-optical columns 702 may be spaced such that no electron-optical columns 702 are positioned outside the boundaries of the surface of the sample 722.

Figure 7C:
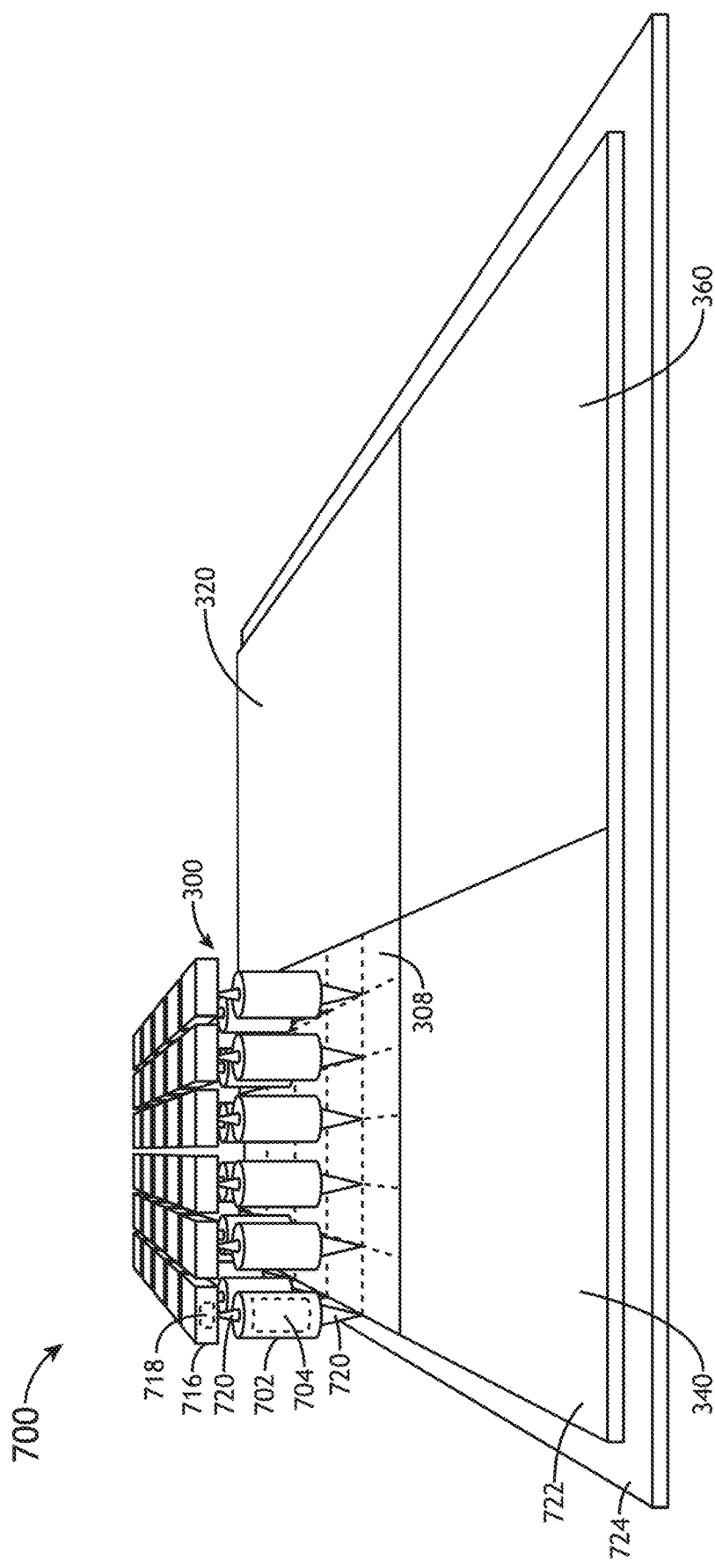
FIG. 7C illustrates a simplified block diagram of a characterization tool configured with a multi-column spacing for photomask/reticle inspection or wafer print check verification, in accordance with one or more embodiments of the present disclosure.

In another embodiment, as illustrated in FIG. 7C, the two or more electron-optical columns 702 are spaced such that a field area of the surface of the sample 722 is inspected (e.g., the two or more electron-optical columns 702 may inspect two or more inspection areas 308 within a field area (or quadrant) 300 of the surface of the sample 722, as illustrated in FIG. 3). For example, the two or more inspection areas 308 may be spaced either with or without image overlap for stitching images together into a single combined image. By way of another example, the two or more electron-optical columns 702 may be spaced such that no electron-optical columns 702 are positioned outside of the boundaries of the field area 300. In another embodiment, the remainder of the surface of the sample 722 (e.g., the field areas (or quadrants) 320, 340, 360, as illustrated in FIG. 3) is inspected following the inspection of the field area 300. For example, the field areas 300, 320, 340, 360 may be spaced either with or without image overlap for stitching images together into a single combined image.

Figure 7D:
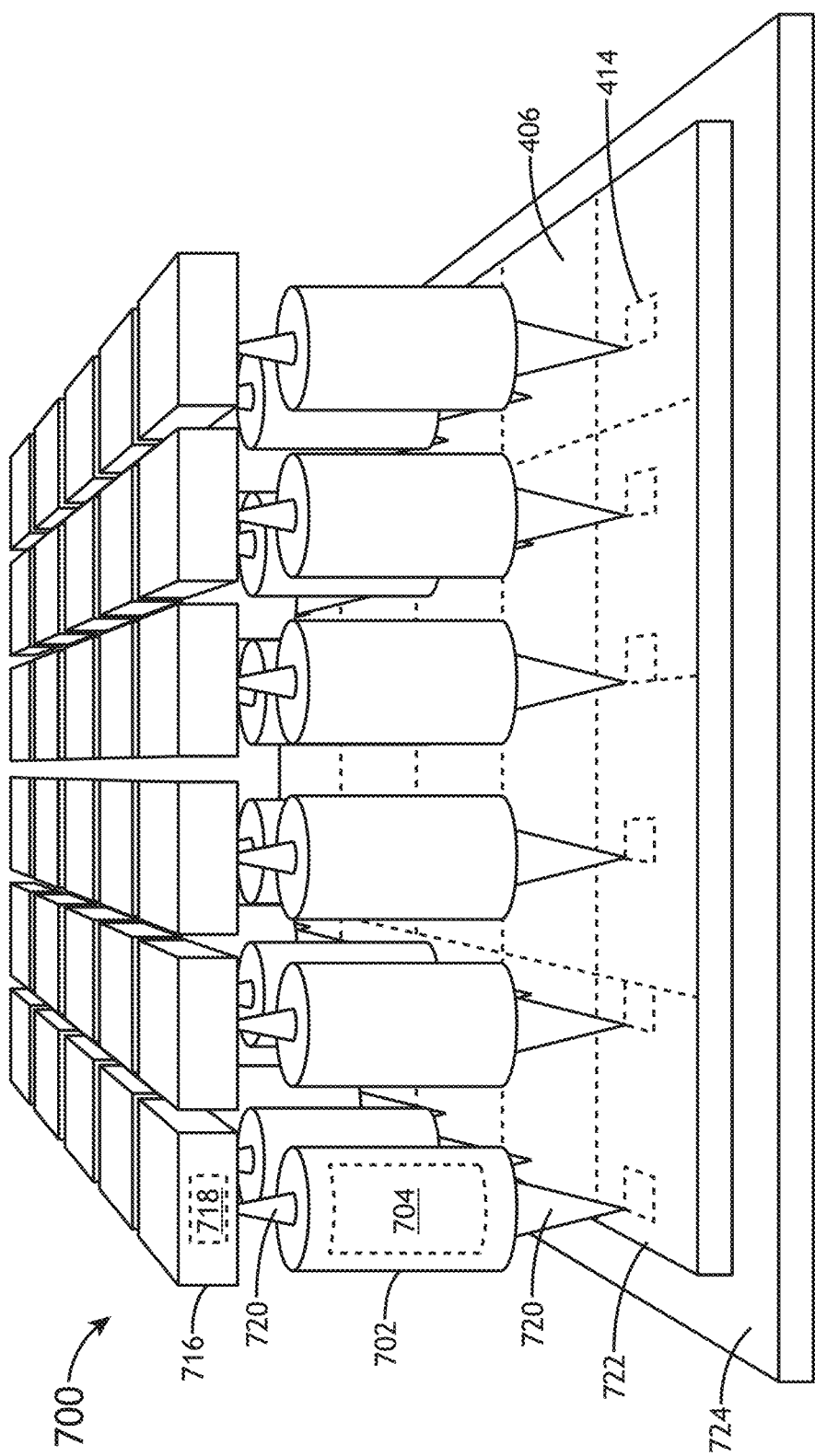
FIG. 7D illustrates a simplified block diagram of a characterization tool configured with a multi-column spacing for photomask/reticle inspection or wafer print check verification, in accordance with one or more embodiments of the present disclosure.

In another embodiment, as illustrated in FIG. 7D, the two or more electron-optical columns 702 are spaced such that they may be used to inspect two or more inspection areas 414 separated between two or more field areas 406 on the surface of the sample 722 (e.g., as illustrated in FIG. 4A). For example, a pattern may be printed two or more times within the two or more field areas 406 on the surface of the sample 722. By way of another example, the two or more field areas 406 may be spaced either with or without image overlap for stitching images together into a single combined image. By way of another example, the two or more electron-optical columns 702 may be spaced such that no electron-optical columns 702 are positioned outside of the boundaries of the surface of the sample 722.

Figure 7E:
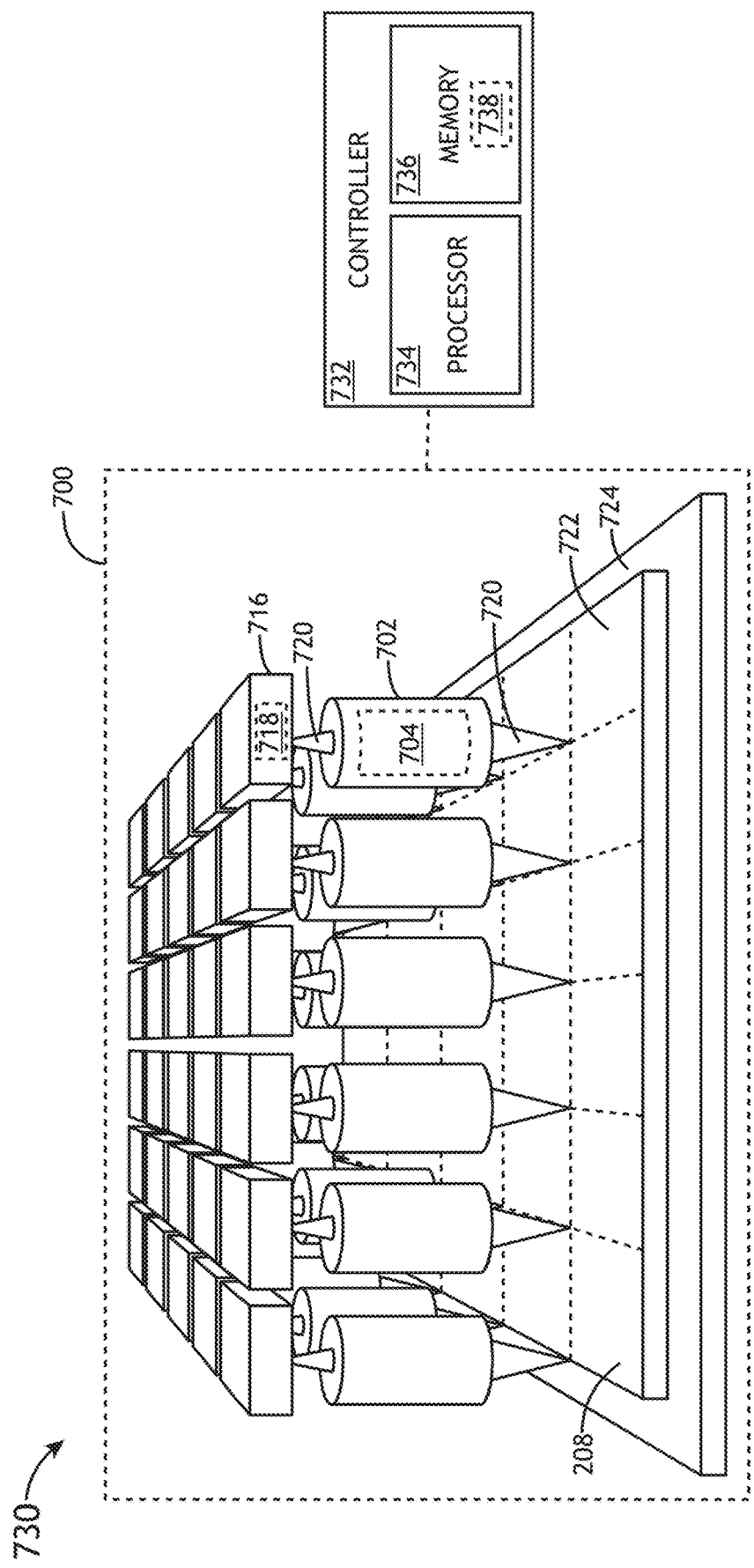
FIG. 7E illustrates a simplified block diagram of a characterization system including a controller and a characterization tool configured with a multi-column spacing for photomask/reticle inspection or wafer print check verification, in accordance with one or more embodiments of the present disclosure.

FIG. 7E illustrates a characterization system 730 including the characterization tool 700 and a controller 732, in accordance with one or more embodiments of the present disclosure. In one embodiment, the controller 732 is operably coupled to one or more components of the characterization tool 700. For example, the controller 732 may be operably coupled to the two or more electron-optical columns 702 and/or components of the two or more electron-optical columns 702 (e.g., the detectors 714), the two or more electron beam sources 716 and/or components of the two or more electron beam sources 706, and/or the sample stage 724. In this regard, the controller 732 may direct any of the components of the characterization tool 700 to carry out any one or more of the various functions described throughout the present disclosure.

In another embodiment, the controller 732 includes one or more processors 734 and memory 736. In another embodiment, the memory 736 stores a set of program instructions 738. In another embodiment, the set of program instructions 738 is configured to cause the one or more processors 734 to carry out any of the one or more process steps described throughout the present disclosure (e.g., inspecting the sample 722, or the like).

The controller 732 may be configured to receive and/or acquire data or information from other systems or tools (e.g., one or more sets of information from the two or more electron-optical columns 702 and/or components of the two or more electron-optical columns 702 (e.g., detectors 714), the two or more electron beam sources 706 and/or components of the two or more electron beam sources 706, and/or the sample stage 724) of the characterization tool 700 by a transmission medium that may include wireline and/or wireless portions. In addition, the controller 732 may be configured to transmit data or information (e.g., the output of one or more procedures of the inventive concepts disclosed herein) to one or more systems or tools (e.g., one or more sets of information from the two or more electron-optical columns 702 and/or components of the two or more electron-optical columns 702 (e.g., detectors 714), the two or more electron beam sources 706 and/or components of the two or more electron beam sources 706, and/or the sample stage 724) of the characterization tool 700 by a transmission medium that may include wireline and/or wireless portions. In this regard, the transmission medium may serve as a data link between the controller 732 and the other subsystems of the characterization tool 700. In addition, the controller 732 may be configured to send data to external systems via a transmission medium (e.g., network connection).

The one or more processors 734 may include any one or more processing elements known in the art. In this sense, the one or more processors 734 may include any microprocessor device configured to execute algorithms and/or program instructions. For example, the one or more processors 734 may consist of a desktop computer, mainframe computer system, workstation, image computer, parallel processor, handheld computer (e.g., tablet, smartphone, or phablet), or other computer system (e.g., networked computer). In general, the term "processor" may be broadly defined to encompass any device having one or more processing elements, which execute the set of program instructions 738 from a non-transitory memory medium (e.g., the memory 736). Moreover, different subsystems of the characterization tool 700 (e.g., one or more sets of information from the two or more electron-optical columns 702 and/or components of the two or more electron-optical columns 702 (e.g., detectors 714), the two or more electron beam sources 706 and/or components of the two or more electron beam sources 706, and/or the sample stage 724) may include processor or logic elements suitable for carrying out at least a portion of the steps described throughout the present disclosure (e.g., inspecting the sample 722, or the like). Therefore, the above description should not be interpreted as a limitation on the present disclosure but merely an illustration.

The memory 736 may include any storage medium known in the art suitable for storing the set of program instructions 738 executable by the associated one or more processors 734. For example, the memory 736 may include a non-transitory memory medium. For instance, the memory 736 may include, but is not limited to, a read-only memory (ROM), a random access memory (RAM), a magnetic or optical memory device (e.g., disk), a magnetic tape, a solid state drive, and the like. The memory 736 may be configured to provide display information to a display device of a user interface. In addition, the memory 736 may be configured to store user input information from a user input device of the user interface. The memory 736 may be housed in a common controller 732 housing with the one or more processors 734. The memory 736 may, alternatively or in addition, be located remotely with respect to the spatial location of the processors 734 and/or the controller 732. For instance, the one or more processors 734 and/or the controller 732 may access a remote memory 736 (e.g., server), accessible through a network (e.g., internet, intranet, and the like).

In one embodiment, the characterization tool 700 includes a user interface. In another embodiment, the user interface is coupled to the controller 732 (e.g., physically coupled, communicatively coupled, or both physically and communicatively coupled). In another embodiment, the user interface includes a display. In another embodiment, the user interface includes a user input device. In another embodiment, the display device is coupled to the user input device. For example, the display device may be coupled to the user input device by a transmission medium that may include wireline and/or wireless portions.

The display device may include any display device known in the art. For example, the display device may include, but is not limited to, a liquid crystal display (LCD). By way of another example, the display device may include, but is not limited to, an organic light-emitting diode (OLED) based display. By way of another example, the display device may include, but is not limited to a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user input device (e.g., touchscreen, bezel mounted interface, keyboard, mouse, trackpad, and the like) is suitable for implementation in the present invention.

The user input device may include any user input device known in the art. For example, the user input device may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device, or the like. In the case of a touchscreen interface, those skilled in the art should recognize that a large number of touchscreen interfaces may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user input device may include, but is not limited to, a bezel mounted interface.

While embodiments of the present disclosure illustrate that the controller 732 may be coupled to the characterization tool 700 or integrated into the characterization tool 700 as a component, the controller 732 is not an integral or required component of the characterization system 730 or the characterization tool 700. In addition, while embodiments of the present disclosure illustrate a user interface may be coupled to the controller 732 or integrated into the controller 732 as a component, the user interface is not an integral or required component of the controller 732, the characterization system 730, or the characterization tool 700. Therefore, the above description should not be interpreted as a limitation on the scope of the present disclosure but merely an illustration.

In one embodiment, although not shown, the characterization tool 700 is an optical inspection tool including two or more illumination paths that separate a full field of the sample 722 into two or more inspection areas. For example, the optical inspection tool may include an optical inspection tool capable of generating one or more high-resolution images representing the electrical intent of a sample 722. By way of another example, the optical inspection tool may include a broadband inspection tool including, but not limited to, a laser sustained plasma (LSP) based inspection tool. By way of another example, the optical inspection tool may include a narrowband inspection tool including, but not limited to, a laser scanning inspection tool. By way of another example, the optical inspection tool may include, but is not limited to, a brightfield inspection tool or a darkfield inspection tool. It is noted herein that the characterization tool 700 may include any optical tool configured to collect and analyze illumination reflected, scattered, diffracted, and/or radiated from the sample 722.

In one embodiment, the optical inspection tool includes one or more illumination sources. The one or more illumination sources may include any illumination source known in the art configured to generate radiation. For example, the illumination source may include, but is not limited to, a broadband illumination source (e.g., a Xenon lamp) or a narrowband illumination source (e.g., a laser). By way of another example, the illumination source may be configured to generate DUV, UV, VUV, and/or EUV illumination. For instance, the EUV illumination source may include a discharge produced plasma (DPP) illumination source or a laser produced plasma (LPP) illumination source configured to generate illumination in the EUV range. By way of another example, the illumination source may be configured to generate X-ray radiation. In another embodiment, the illumination source may be operably coupled to a set of positioners configured to actuate the illumination source in one or more directions.

In another embodiment, the one or more illumination sources generates and directs illumination (e.g., a beam of illumination) to the surface of the sample 722. For example, the illumination source may be configured to direct illumination to the surface of the sample 722 disposed on the sample stage via one or more sets of optical elements. It is noted herein the one or more sets of optical elements may include any optical element known in the art suitable for focusing, suppressing, extracting, and/or directing the illumination. In addition, it is noted herein the one or more sets of optical elements may be considered to be a set of focusing optics for purposes of the present disclosure.

In another embodiment, the sample reflects, scatters, diffracts, and/or radiates illumination (e.g., a beam of illumination) in response to the illumination from the illumination source. In another embodiment, the illumination from the sample is directed to one or more optical detectors. The one or more optical detectors may include any optical detector known in the art. For example, the one or more detectors may include, but are not limited to, photo-multiplier tubes (PMTs), charge coupled devices (CCDs), time-delay integration (TDI) cameras, or the like.

In another embodiment, the illumination from the sample is directed to the one or more optical detectors via one or more sets of optical elements. It is noted herein the one or more sets of optical elements may include any optical element known in the art suitable for focusing, suppressing, extracting, and/or directing the illumination. In addition, it is noted herein the one or more sets of optical elements may be considered to be a set of collection optics for purposes of the present disclosure. Further, it is noted herein that the set of focusing optics and the set of collection optics may share at least some of one or more sets of optical elements.

In another embodiment, one or more components of the optical inspection tool (e.g., the one or more illumination sources, the stage, the one or more detectors, or the like) is coupled to the controller 732.

Advantages of the present disclosure are directed to a multi-column spacing for photomask/reticle inspection and wafer print check verification. Advantages of the present disclosure are also directed to a method of determining a multi-column spacing for photomask/reticle inspection and wafer print check verification. Advantages of the present disclosure are also directed to a characterization tool and characterization system configured with a multi-column spacing for photomask/reticle inspection and wafer print check verification.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures. Electronic circuitry, for example, may have one or more paths of electrical current constructed and arranged to implement various functions as described herein. In some implementations, one or more media may be configured to bear a device-detectable implementation when such media hold or transmit device-detectable instructions operable to perform as described herein. In some variants, for example, implementations may include an update or modification of existing software or firmware, or of gate arrays or programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively, or additionally, implementations may include executing a special-purpose instruction sequence or invoking circuitry for enabling, triggering, coordinating, requesting, or otherwise causing one or more occurrences of virtually any functional operations described herein. In some variants, operational or other logical descriptions herein may be expressed as source code and compiled or otherwise invoked as an executable instruction sequence. In some contexts, for example, implementations may be provided, in whole or in part, by source code, such as C++, or other code sequences. In other implementations, source or other code implementation, using commercially available and/or techniques in the art, may be compiled/implemented/translated/converted into a high-level descriptor language (e.g., initially implementing described technologies in C, C++, python, Ruby on Rails, Java, PHP, .NET, or Node.js programming language and thereafter converting the programming language implementation into a logic-synthesizable language implementation, a hardware description language implementation, a hardware design simulation implementation, and/or other such similar mode(s) of expression). For example, some or all of a logical expression (e.g., computer programming language implementation) may be manifested as a Verilog-type hardware description (e.g., via Hardware Description Language (HDL) and/or Very High Speed Integrated Circuit Hardware Descriptor Language (VHDL)) or other circuitry model which may then be used to create a physical implementation having hardware (e.g., an Application Specific Integrated Circuit). Those skilled in the art will recognize how to obtain, configure, and optimize suitable transmission or computational elements, material supplies, actuators, or other structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof; and a wide range of components that may impart mechanical force or motion such as rigid bodies, spring or torsional bodies, hydraulics, electro-magnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Although a user is described herein as a single figure, those skilled in the art will appreciate that the user may be representative of a human user, a robotic user (e.g., computational entity), and/or substantially any combination thereof (e.g., a user may be assisted by one or more robotic agents) unless context dictates otherwise. Those skilled in the art will appreciate that, in general, the same may be said of "sender" and/or other entity-oriented terms as such terms are used herein unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B.

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although particular embodiments of this invention have been illustrated, it is apparent that various modifications and embodiments of the invention may be made by those skilled in the art without departing from the scope and spirit of the foregoing disclosure. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

What is claimed:

1. A multi-column assembly for a scanning electron microscopy (SEM) system, comprising:
   a plurality of electron-optical columns arranged in an array defined by one or more spacings, wherein each electron-optical column includes one or more electron-optical elements,
   wherein the plurality of electron-optical columns is configured to characterize a field area on a surface of a sample secured on a stage,
   wherein a number of electron-optical columns in the plurality of electron-optical columns equals an integer number of inspection areas in the field area,
   wherein the one or more spacings of the plurality of electron-optical columns correspond to one or more dimensions of the inspection areas,
   wherein the electron-optical columns are spaced such that a total inspection area of the plurality of electron-optical columns matches a full field of the sample,
   wherein the electron-optical columns are spaced such that the area inspected by each electron-optical column is equal, wherein at least one set of adjacent inspection areas of the integer number of inspection areas at least partially overlap.

2. The multi-column assembly in claim 1, wherein the one or more spacings including a first spacing in a first direction and at least a second spacing in at least a second direction.

3. The multi-column assembly in claim 2, wherein the first spacing in the first direction and the at least the second spacing in the at least the second direction are different.

4. The multi-column assembly in claim 2, wherein the first spacing in the first direction and the at least the second spacing in the at least the second direction are equal.

5. The multi-column assembly in claim 1, wherein the adjacent inspection areas of the integer number of inspection areas do not overlap.

6. The multi-column assembly in claim 1, wherein the field area on the surface of the sample includes a single field area on the surface of the sample, wherein the single field area is separated into the integer number of inspection areas.

7. The multi-column assembly in claim 1, wherein the field area on the surface of the sample includes a first field area and at least a second field area, wherein the first field area and the at least the second field area each include the integer number of inspection areas.

8. The multi-column assembly in claim 7, wherein the plurality of electron-optical columns are configured to characterize the first field area and the at least the second field area in sequence.

9. The multi-column assembly in claim 8, wherein the plurality of electron-optical columns are configured to characterize the integer number of inspection areas in the at least the second field area after characterizing the integer number of inspection areas in the first field area.

10. The multi-column assembly in claim 7, wherein the first field area and the at least the second field area do not overlap.

11. The multi-column assembly in claim 7, wherein the first field area and the at least the second field area at least partially overlap.

12. The multi-column assembly in claim 7, wherein the first field area and the at least the second field area are substantially equal in size.

13. The multi-column assembly in claim 7, wherein the first field area is different in size than the at least the second field area.

14. The multi-column assembly in claim 1, wherein the plurality of electron-optical columns receive a plurality of electron beams generated by a plurality of electron beam sources.

15. The multi-column assembly in claim 14, wherein each electron-optical column of the plurality of electron-optical columns receives an electron beam of the plurality of electron beams.

16. The multi-column assembly in claim 14, wherein the plurality of electron-optical columns directs the plurality of electron beams to the surface of the sample.

17. The multi-column assembly in claim 16, wherein the sample emits or scatters electrons in response to at least one electron beam of the plurality of electron beams.

18. The multi-column assembly in claim 17, wherein at least one electron-optical column of the plurality of electron-optical columns detects at least a portion of the emitted or scattered electrons.

19. The multi-column assembly in claim 1, wherein the sample comprises:
    at least one of a photomask or a reticle.

20. A multi-column scanning electron microscopy (SEM) system, comprising:
    an electron beam source assembly comprising a plurality of electron beam sources configured to generate a plurality of electron beams;
    a stage configured to secure a sample; and
    a multi-column assembly, comprising: a plurality of electron-optical columns arranged in an array defined by one or more spacings, wherein each electron-optical column includes one or more electron-optical elements,
    wherein the plurality of electron-optical columns is configured to characterize a field area on a surface of the sample secured on the stage,
    wherein a number of electron-optical columns in the plurality of electron-optical columns equals an integer number of inspection areas in the field area,
    wherein the one or more spacings of the plurality of electron-optical columns correspond to one or more dimensions of the inspection areas,
    wherein the electron-optical columns are spaced such that a total inspection area of the plurality of electron-optical columns matches a full field of the sample,
    wherein the electron-optical columns are spaced such that the area inspected by each electron-optical column is equal, wherein at least one set of adjacent inspection areas of the integer number of inspection areas at least partially overlap.

21. A method, comprising:
    characterizing a field area on a surface of a sample via a plurality of electron-optical columns of a multi-column scanning electron microscopy (SEM) review tool arranged in an array defined by one or more spacings, wherein each electron-optical column includes one or more electron-optical elements,
    wherein a number of electron-optical columns in the plurality of electron-optical columns equals an integer number of inspection areas in the field area, wherein the one or more spacings of the plurality of electron-optical columns correspond to one or more dimensions of the inspection areas, wherein the electron-optical columns are spaced such that a total inspection area of the plurality of electron-optical columns matches a full field of the sample, wherein the electron-optical columns are spaced such that the area inspected by each electron-optical column is equal, wherein at least one set of adjacent inspection areas of the integer number of inspection areas at least partially overlap.

* * * * *